US012566479B2

(12) United States Patent (10) Patent No.: US 12,566,479 B2
Kim et al. (45) Date of Patent: Mar. 3, 2026

(54) DISPLAY DEVICE

(71) Applicant: LG Display Co., Ltd., Seoul (KR)

(72) Inventors: Hanseok Kim, Paju-si (KR); Taeyoung Jung, Daegu (KR); Seungbum Heo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 183 days.

(21) Appl. No.: 18/589,039

(22) Filed: Feb. 27, 2024

(65) Prior Publication Data

US 2024/0288913 A1 Aug. 29, 2024

(30) Foreign Application Priority Data

Feb. 28, 2023 (KR) ......................... 10-2023-0027103

(51) Int. Cl.
 *G06F 1/16* (2006.01)
 *G06F 1/20* (2006.01)
 *H01L 25/075* (2006.01)
(52) U.S. Cl.
 CPC .......... *G06F 1/1688* (2013.01); *G06F 1/1647* (2013.01); *G06F 1/203* (2013.01); *H01L 25/0753* (2013.01)

(58) Field of Classification Search
 CPC .............. H04R 2499/15; H05K 5/0017; G06F 1/1688; G06F 1/1647; G06F 1/203; G09F 9/33; G09F 9/3026; G09G 3/32; H01L 25/0753; H01L 25/167; H10H 20/85; H10H 20/857
 See application file for complete search history.

(56) References Cited

U.S. PATENT DOCUMENTS

2019/0122018 A1* 4/2019 Kho ................... G06V 40/1306

* cited by examiner

*Primary Examiner* — Tuan D Nguyen
(74) *Attorney, Agent, or Firm* — Morgan, Lewis & Bockius LLP

(57) ABSTRACT

A display device may include a display panel, a speaker disposed on a rear surface of the display panel, a printed circuit board which is disposed on the rear surface of the display panel and is spaced apart from the speaker, and a cover bottom which is disposed between the display panel and the printed circuit board and includes a forming unit corresponding to the speaker. The forming unit may protrude in a direction perpendicular to the rear surface of the display panel to accommodate the speaker.

20 Claims, 15 Drawing Sheets

<u>100</u>

DISPLAY DEVICE

CROSS-REFERENCE TO RELATED APPLICATIONS

This application claims the benefit of and priority to Korean Patent Application No. 10-2023-0027103 filed on Feb. 28, 2023, in the Korean Intellectual Property Office, the entire disclosure of which is incorporated herein by reference for all purposes.

BACKGROUND

Technical Field

The present disclosure relates to a display device, and more particularly, for example, to a display device using a light emitting diode (LED).

Description of the Related Art

Display devices may be used for, among others, a monitor of a computer, a television, a cellular phone, or the like, and a display device may employ, for example, an organic light emitting display (OLED) device which is a self-emitting device, a liquid crystal display (LCD) device which requires a separate light source, or the like.

An applicable range of the display device is diversified to personal digital assistants as well as monitors of computers and televisions and a display device with a large display area and a reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast lighting speed, excellent luminous efficiency, and a strong impact resistance so that a stability is excellent and an image having a high luminance may be displayed.

The description of the related art should not be assumed to be prior art merely because it is mentioned in or associated with this section. The description of the related art may include information that describes one or more aspects of the subject technology, and the description in this section does not limit the invention.

SUMMARY

One or more aspects of the present disclosure are directed to providing a display device including a speaker.

One or more other aspects of the present disclosure are directed to providing a display device which improves a sound quality.

Still one or more other aspects of the present disclosure are directed to providing a display device which reduces a manufacturing cost.

Still one or more other aspects of the present disclosure are directed to providing a display device which reduces a temperature deviation of a display panel and increases a heat dissipation efficiency.

Still one or more other aspects of the present disclosure are directed to providing a tiling display device which shares a structure of a plurality of display devices regardless of whether a speaker is included.

Aspects of the present disclosure are not limited to the above-mentioned aspects, and other aspects, which are not mentioned above, can be clearly understood by those skilled in the art from the following descriptions.

According to an aspect of the present disclosure, a display device includes a display panel, a speaker disposed on a rear surface of the display panel, a printed circuit board which is disposed on the rear surface of the display panel and is spaced apart from the speaker, and a cover bottom which is disposed between the display panel and the printed circuit board and includes a forming unit corresponding to the speaker. The forming unit may protrude in a direction perpendicular to the rear surface of the display panel to accommodate the speaker.

According to an aspect of the present disclosure, a tiling display device is a tiling display device in which a plurality of display devices is connected. Each of the plurality of display devices may include a display panel, a printed circuit board disposed on a rear surface of the display panel, and a cover bottom which is disposed between the display panel and the printed circuit board and includes a forming unit spaced apart from the printed circuit board. The forming unit may protrude in a direction perpendicular to the rear surface of the display panel, and some of the plurality of display devices may further include a speaker disposed so as to correspond to the forming unit on the rear surface of the display panel.

Other detailed matters of the exemplary embodiments are included in the detailed description and the drawings.

According to one or more aspects of the present disclosure, a display device including a speaker is implemented by simply changing a structure of a cover bottom.

According to one or more aspects of the present disclosure, an enclosure is implemented by changing a structure of a cover bottom to improve a sound quality of the display device.

According to one or more aspects of the present disclosure, a structure of the cover bottom is changed to reduce a material cost of the display device.

According to one or more aspects of the present disclosure, a temperature deviation is reduced and a heat dissipation efficiency is increased to minimize the recognition of the spots or color difference of the display panel.

According to one or more aspects of the present disclosure, a structure of the plurality of display devices which configures the tiling display device is shared regardless of whether a speaker is included to simplify the process and save the manufacturing cost.

The effects according to one or more aspects of the present disclosure are not limited to the contents exemplified above, and more various effects are included in the present specification.

Other aspects, effects, devices, methods, features and advantages will be, or will become, apparent to one with skill in the art upon examination of the drawings and detailed description herein. It is intended that all such aspects, effects, devices, methods, features and advantages be included within this description, be within the scope of the present disclosure, and be protected by the following claims. Nothing in this section should be taken as a limitation on the claims. Further aspects and advantages are discussed below in conjunction with embodiments of the disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure. In the drawings.

Figure 1:
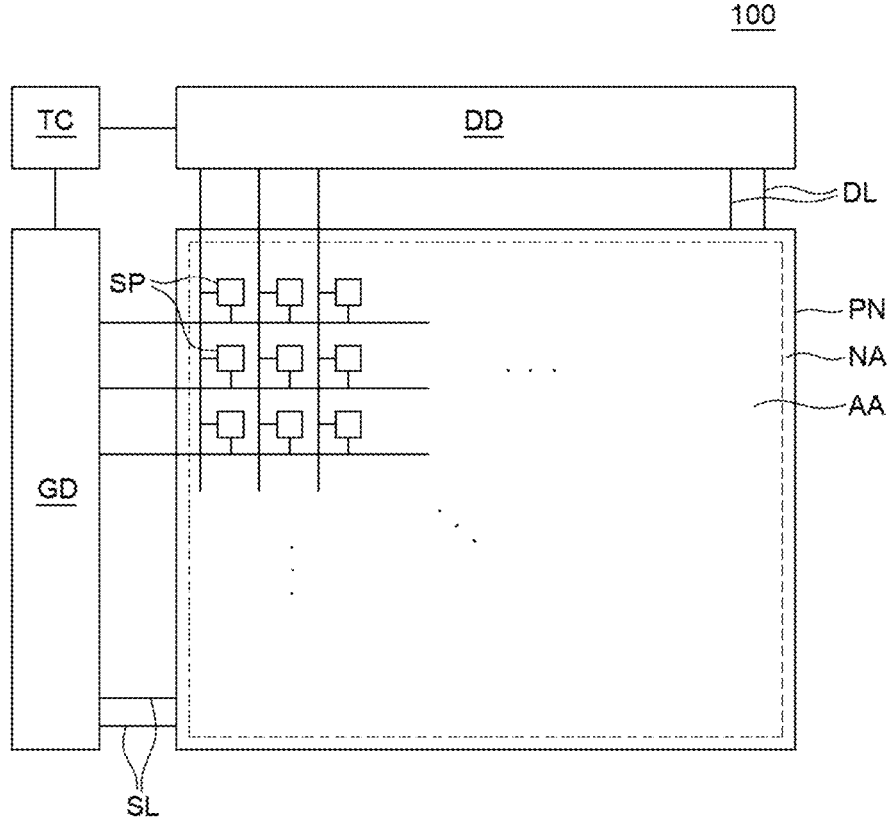
FIG. 1 is a schematic diagram of a display device according to an exemplary embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

The terms of a singular form may include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic diagram of a display device according to an exemplary embodiment of the present disclosure.

Figure 2A:
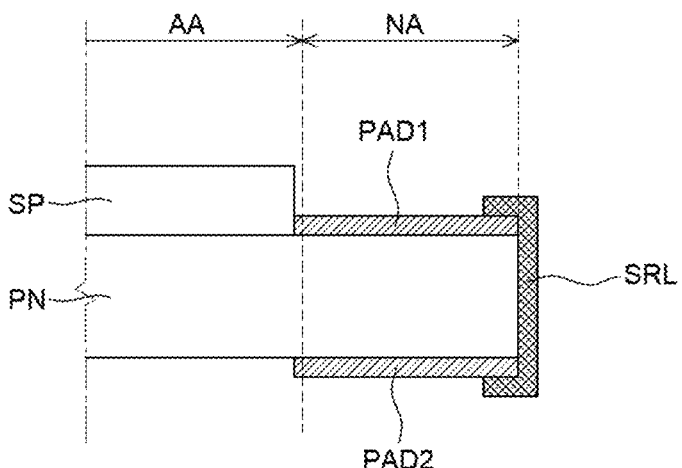
FIG. 2A is a partial cross-sectional view of a display device according to an exemplary embodiment of the present disclosure.

FIG. 2A is a partial cross-sectional view of a display device according to an exemplary embodiment of the present disclosure.

Figure 2B:
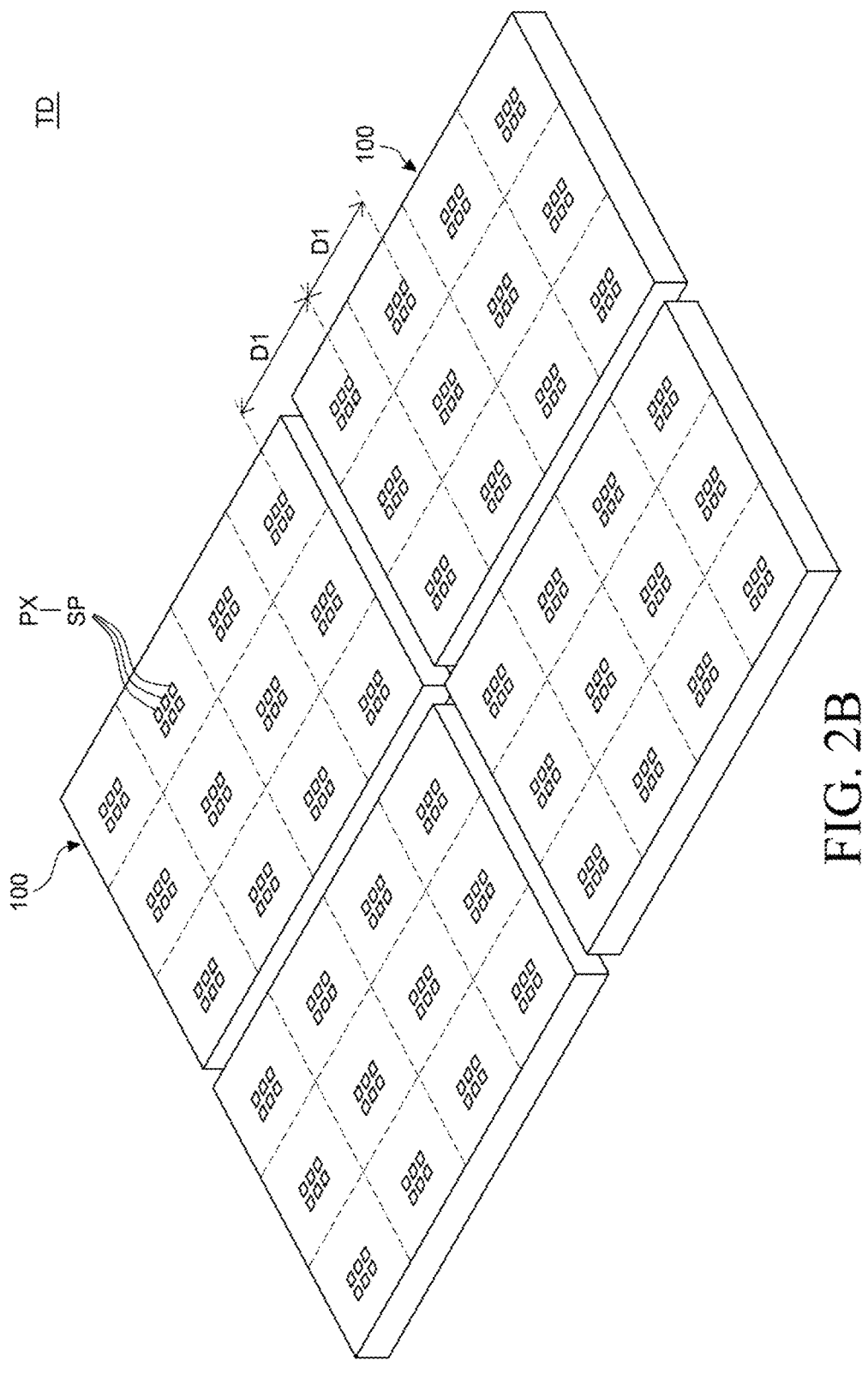
FIG. 2B is a perspective view of a tiling display device according to an exemplary embodiment of the present disclosure.

FIG. 2B is a perspective view of a tiling display device according to an exemplary embodiment of the present disclosure.

In FIG. 1, for the convenience of description, among various components of the display device 100, only a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC into a data voltage using a reference gamma voltage in accordance with a plurality of data control signals supplied from the timing controller TC. The data driver DD may supply the converted data voltage to the plurality of data lines DL.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Further, the timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. In addition, even though it is not illustrated in the drawing, each of the plurality of sub pixels SP may be connected to a high potential power line, a low potential power line, and a reference line.

In the display panel PN, an active area AA and the non-active area NA enclosing the active area AA may be defined.

The active area AA is an area in which images are displayed in the display device 100. In the active area AA, a plurality of sub pixels SP which configures a plurality of pixels PX and a circuit for driving the plurality of sub pixels SP may be disposed. The plurality of sub pixels SP is a minimum unit which configures the active area AA and n sub pixels SP form one pixel PX. In each of the plurality of sub pixels SP, a light emitting diode and a thin film transistor for driving the light emitting diode may be disposed. The plurality of light emitting diodes may be defined in different manners depending on the type of the display panel PN. For example, when the display panel PN is an inorganic light emitting display panel, the light emitting diode may be a light emitting diode (LED) or a micro light emitting diode (LED).

In the active area AA, a plurality of wiring lines which transmits various signals to the plurality of sub pixels SP is disposed. For example, the plurality of wiring lines includes a plurality of data lines DL which supplies a data voltage to each of the plurality of sub pixels SP and a plurality of scan lines SL which supplies a scan signal to each of the plurality of sub pixels SP. The plurality of scan lines SL extends in one direction in the active area AA to be connected to the plurality of sub pixels SP and the plurality of data lines DL extends in a direction different from the one direction in the active area AA to be connected to the plurality of sub pixels SP. In addition, in the active area AA, a low potential power line and a high potential power line may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

However, the non-active area NA may be located on a rear surface of the display panel PN, that is, a surface on which the sub pixels SP are not disposed or may be omitted, and is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board. The data driver DD and the timing controller TC are electrically connected to the display panel PN by bonding the flexible film and the printed circuit board to the pad electrode formed in the non-active area NA of the display panel PN.

If the gate driver GD is mounted in the GIP manner and the data driver DD and the timing controller TC transmit a signal to the display panel PN through a pad electrode of the non-active area NA, an area of the non-active area NA for disposing the gate driver GD and the pad electrode is necessary more than a predetermined level. Accordingly, a bezel may be increased.

In contrast, the gate driver GD is mounted in the active area AA in the GIA manner and a side line SRL which connects the signal line on the front surface of the display panel PN to the pad electrode on a rear surface of the display panel PN is formed to bond the flexible film and the printed circuit board onto a rear surface of the display panel PN. At this case, the non-active area NA may be minimized on the front surface of the display panel PN. That is, when the gate driver GD, the data driver DD, and the timing controller TC are connected to the display panel PN as described above, a zero bezel with substantially no bezel may be implemented.

Specifically, referring to FIGS. 2A and 2B, in the non-active area NA of the display panel PN, a plurality of pad electrodes for transmitting various signals to the plurality of sub pixels SP is disposed. For example, in the non-active area NA on the front surface of the display panel PN, a first pad electrode PAD1 which transmits a signal to the plurality of sub pixels SP is disposed. In the non-active area NA on the rear surface of the display panel PN, a second pad electrode PAD2 which is electrically connected to a driving component, such as a flexible film and the printed circuit board, is disposed. That is, on the front surface of the display panel PN on which images are displayed, only a pad area of the non-active area NA in which the first pad electrode PAD1 is disposed may be formed at minimum.

In this case, even though it is not illustrated in the drawing, various signal lines connected to the plurality of sub pixels SP, for example, a scan line SL or a data line DL extends from the active area AA to the non-active area NA to be electrically connected to the first pad electrode PAD1.

Further, the side line SRL is disposed along a side surface of the display panel PN. The side line SRL may electrically connect a first pad electrode PAD1 on the front surface of the display panel PN and a second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA on the front surface of the display panel PN.

Further, referring to FIG. 2B, a tiling display device TD having a large screen size may be implemented by connecting a plurality of display devices 100. At this time, as illustrated in FIG. 2A, when the tiling display device TD is implemented using a display device 100 with a minimized bezel, a seam area in which an image between the display devices 100 is not displayed is minimized so that a display quality may be improved.

For example, the plurality of sub pixels SP forms one pixel PX and a distance D1 between an outermost pixel PX of one display device 100 and an outermost pixel PX of another display device 100 adjacent to one display device may be implemented to be equal to a distance D1 between pixels PX in one display device 100. Accordingly, a constant distance D1 between pixels PX between the display devices 100 is configured to minimize the seam area.

However, FIGS. 2A and 2B are illustrative so that the display device 100 according to the exemplary embodiment of the present disclosure may be a general display device 100 with a bezel, but is not limited thereto.

Figure 3:
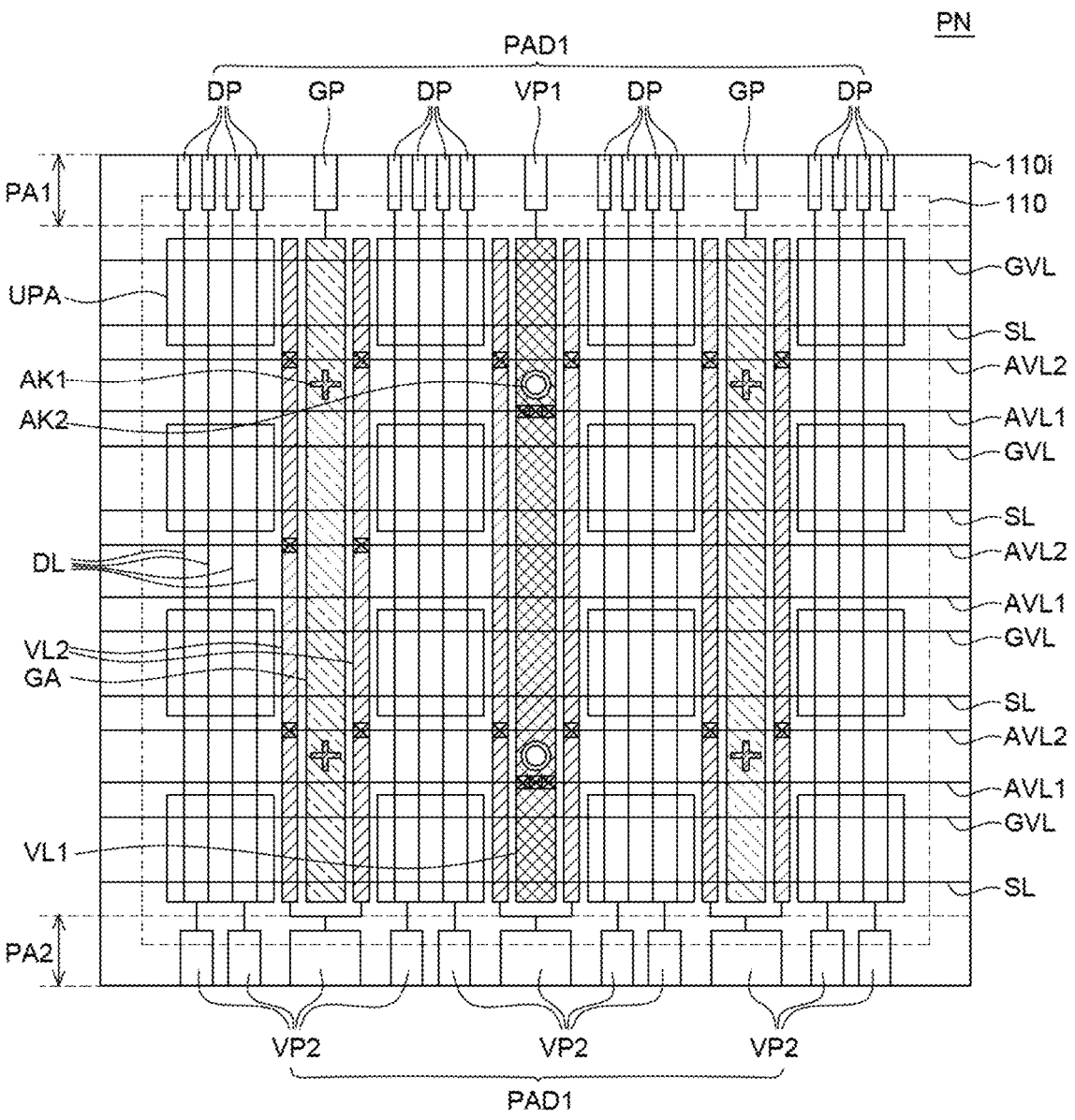
FIG. 3 is a plan view of a display panel of a display device according to an exemplary embodiment of the present disclosure.
Figure 4:
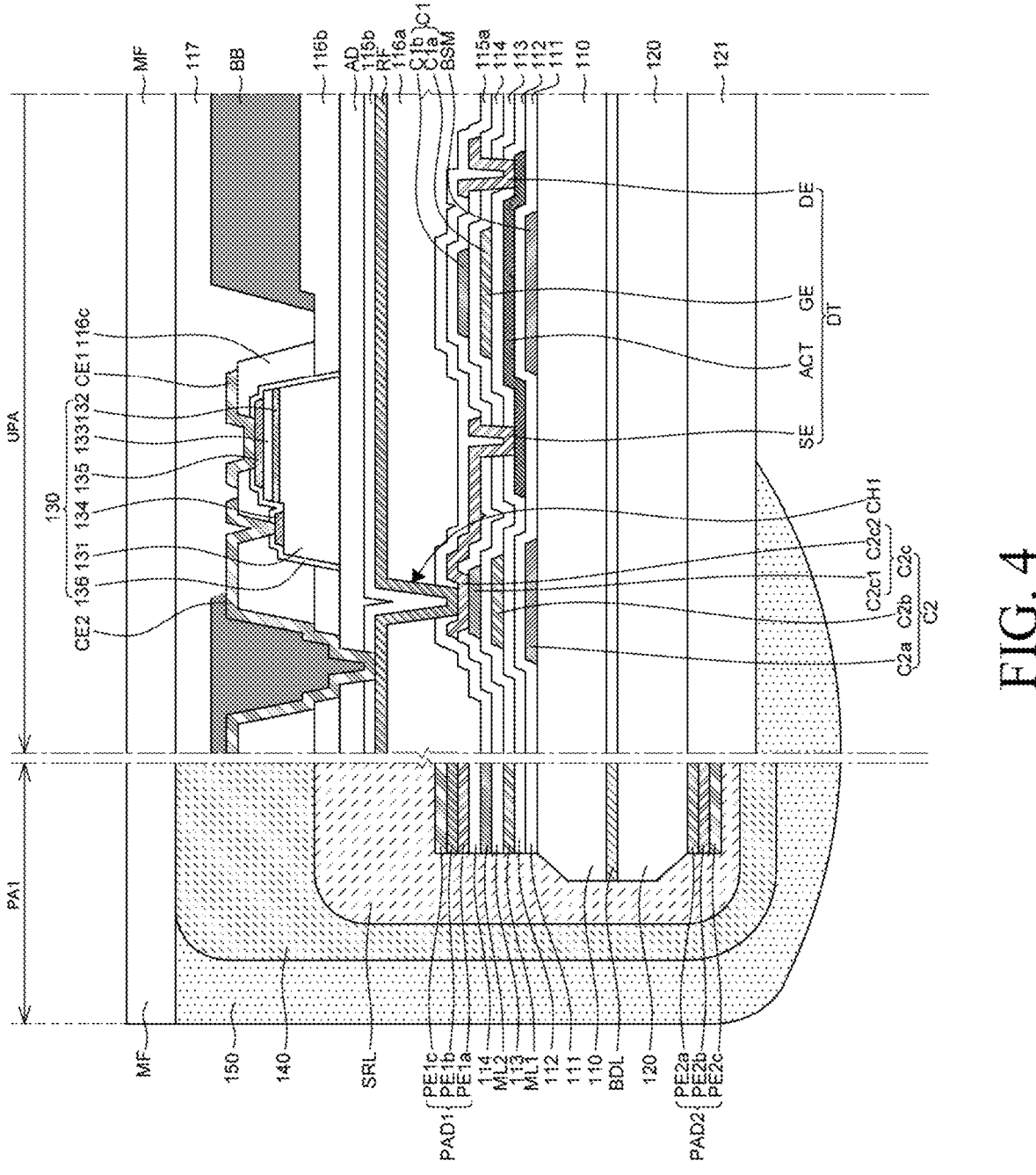
FIG. 4 is a cross-sectional view of a display device according to an exemplary embodiment of the present disclosure.

FIG. 3 is a plan view of a display panel of a display device according to an exemplary embodiment of the present disclosure. FIG. 4 is a cross-sectional view of a display device according to an exemplary embodiment of the present disclosure.

First, referring to FIGS. 3 and 4, the display panel PN includes a first substrate 110. The first substrate 110 is a substrate which supports components disposed above the display device 100 and may be an insulating substrate. A plurality of pixels PX is formed on the first substrate 110 to display images. For example, the first substrate 110 may be formed of glass or resin. Further, the first substrate 110 may include polymer or plastic. In some exemplary embodiments, the first substrate 110 may be formed of a plastic material having flexibility.

In the first substrate 110, a plurality of pixel areas UPA, a plurality of gate driving areas GA, and a plurality of pad areas PA1 and PA2 are disposed. Among them, the plurality of pixel areas UPA and the plurality of gate driving areas GA may be included in the active area AA of the display panel PN.

First, the plurality of pixel areas UPA is areas in which the plurality of pixels PX is disposed. The plurality of pixel areas UPA may be disposed by forming a plurality of rows and a plurality of columns. Each of the plurality of pixels PX disposed in the plurality of pixel areas UPA includes a plurality of sub pixels SP. Each of the plurality of sub pixels SP includes a light emitting diode 130 and a pixel circuit to independently emit light. The plurality of sub pixels SP may include a plurality of sub pixels SP which emits different color light. For example, the plurality of sub pixels SP may include a red sub pixel, a blue sub pixel, and a green sub pixel, but is not limited thereto.

The plurality of gate driving areas GA is areas where gate drivers GD are disposed. The gate driver GD may be mounted in the active area AA in a gate in active area (GIA) manner. For example, the gate driving area GA may be formed along a row direction and/or column direction between the plurality of pixel areas UPA. The gate driver GD formed in the gate driving area GA may supply the scan signal to the plurality of scan lines SL.

The gate driver GD disposed in the gate driving area GA may include a circuit for outputting a scan signal. At this time, the gate driver may include, for example, a plurality of transistors and/or capacitors. Here, active layers of the plurality of transistors may be formed of a semiconductor material, such as an oxide semiconductor, amorphous silicon, or polysilicon, but is not limited thereto. The active layers of the plurality of transistors may be formed of the same material or different materials from each other. Further, the active layers of the transistors of the gate driver may be formed of the same material as active layers of various transistors of the pixel circuit or formed of different materials from each other.

The plurality of pad areas PA1 and PA2 is areas in which a plurality of first pad electrodes PAD1 is disposed. The plurality of first pad electrodes PAD1 may transmit various signals to various wiring lines extending in a column direction in the active area AA. For example, the plurality of first pad electrodes PAD1 includes a data pad DP, a gate pad GP, a high potential power pad VP1, and a low potential power pad VP2. The data pad DP transmits a data voltage to the data line DL and the gate pad GP transmits a clock signal, a start signal, a gate low voltage, and a gate high voltage for driving the gate driver GD to the gate driver GD. The high potential power pad VP1 transmits a high potential power voltage to the high potential power line VL1 and the low potential power pad VP2 transmits a low potential power voltage to the low potential power line VL2.

The plurality of pad areas PA1 and PA2 includes a first pad area PA1 located at an upper edge of the display panel PN and a second pad area PA2 of the display panel PN. At this time, in the first pad area PA1 and the second pad area PA2, different types of first pad electrodes PAD1 may be disposed. For example, in the first pad area PA1, among the plurality of first pad electrodes PAD1, the data pad DP, the gate pad GP, and the high potential power pad VP1 are disposed and in the second pad area PA2, the low potential power pad VP2 may be disposed.

At this time, the plurality of first pad electrodes PAD1 may be formed to have different sizes. For example, the plurality of data pads DP which is connected to the plurality of data lines DL one to one may have a smaller width and the high potential power pad VP1, the low potential power pad VP2, and the gate pad GP may have a larger width. However, widths of the data pad DP, the gate pad GP, the high potential power pad VP1, and the low potential power pad VP2 illustrated in FIG. 3 are illustrative so that the first pad electrode PAD1 may be configured in various sizes, but is not limited thereto.

In the meantime, in order to reduce the bezel of the display panel PN, an edge of the display panel PN may be cut to be removed. The plurality of pixels PX, the plurality of wiring lines, and the plurality of first pad electrodes PAD1 are formed on an initial first substrate 110i and an edge part of the initial first substrate 110i is ground to reduce the bezel area. During the grinding process, a part of the initial first substrate 110i is removed to form a first substrate 110 with a smaller size. At this time, parts of the plurality of first pad electrodes PAD1 and wiring lines disposed at the edge of the first substrate 110 may be removed. Accordingly, only a part of the plurality of first pad electrodes PAD1 may remain on the first substrate 110.

Next, the plurality of data lines DL which extends in a column direction from the plurality of first pad electrodes PAD1 is disposed on the first substrate 110 of the display panel PN. The plurality of data lines DL may extend from the plurality of data pads DP of the first pad area PA1 toward the plurality of pixel areas UPA. The plurality of data lines DL extends in a column direction and may be disposed to overlap the plurality of pixel areas UPA. Therefore, the plurality of data lines DL may transmit the data voltage to the pixel circuit of each of the plurality of sub pixels SP.

The plurality of high potential power lines VL1 extending in the column direction is disposed on the first substrate 110 of the display panel PN. Some of the plurality of high potential power lines VL1 extends from the high potential power pad VP1 of the first pad area PA1 to the plurality of pixel areas UPA to transmit the high potential power voltage to the light emitting diodes 130 of the plurality of sub pixels SP. Further, the others of the plurality of high potential power lines VL1 may be electrically connected to the other high potential power line VL1 by means of an auxiliary high potential power line AVL1 to be described below. In FIG. 3, for the convenience of description, even though it is illustrated that one high potential power line VL1 and one high potential power pad VP1 are disposed, a plurality of high potential power lines VL1 and high potential power pads VP1 may be disposed.

The plurality of low potential power lines VL2 extending in the column direction is disposed on the first substrate 110 of the display panel PN. At least some of the plurality of low potential power lines VL2 extends from the low potential power pad VP2 of the second pad area PA2 to the plurality of pixel areas UPA to transmit the low potential power voltage to the pixel circuit of each of the plurality of sub pixels SP. Further, the others of the plurality of low potential power lines VL2 may electrically be connected to the other low potential power line VL2 by means of an auxiliary low potential power line AVL2 to be described below.

The plurality of scan lines SL extending in the row direction is disposed on the first substrate 110 of the display panel PN. The plurality of scan lines SL extends in the row direction and may be disposed across the plurality of pixel areas UPA and the plurality of gate driving areas GA. The plurality of scan lines SL may transmit the scan signal from the gate driver GD to the pixel circuits of the plurality of sub pixels SP.

A plurality of auxiliary high potential power lines AVL1 extending in the row direction is disposed on the first substrate 110 of the display panel PN. The plurality of auxiliary high potential power lines AVL1 may be disposed in an area between the plurality of pixel areas UPA. The plurality of auxiliary high potential power lines AVL1 extending in the row direction is electrically connected to the plurality of high potential power lines VL1 extending in the column direction through a contact hole to form a mesh structure. Therefore, the plurality of auxiliary high potential power lines AVL1 and the plurality of high potential power lines VL1 are configured to form a mesh structure to minimize voltage drop and voltage deviation.

A plurality of auxiliary low potential power lines AVL2 extending in the row direction is disposed on the first substrate 110 of the display panel PN. The plurality of auxiliary low potential power lines AVL2 may be disposed in an area between the plurality of pixel areas UPA. The plurality of auxiliary low potential power lines AVL2 extending in the row direction is electrically connected to the plurality of low potential power lines VL2 extending in the column direction through a contact hole to form a mesh structure. Therefore, the plurality of auxiliary low potential power lines AVL2 and the plurality of low potential power lines VL2 are configured to form a mesh structure to reduce a resistance of the wiring line and minimize voltage deviation.

The plurality of gate driving lines GVL extending in the row direction is disposed on the first substrate 110 of the display panel PN. The plurality of gate driving lines GVL may transmit various signals to the gate driver GD of the gate driving area GA. The plurality of gate driving lines GVL may include wiring lines which transmit a clock signal, a start signal, a gate high voltage, and a gate low voltage to the gate driver GD. Therefore, various signals are transmitted from the gate driving line GVL to the gate driver GD to drive the gate driver GD.

A plurality of alignment keys AK1 and AK2 is disposed in an area between the plurality of pixel areas UPA in the display panel PN. The plurality of alignment keys AK1 and AK2 is used for alignment during the manufacturing process of the display panel PN. The plurality of alignment keys AK1 and AK2 includes a first alignment key AK1 and a second alignment key AK2.

The first alignment key AK1 is disposed in the gate driving area GA among the areas between the plurality of pixel areas UPA. The first alignment key AK1 may be used to inspect an alignment position of the plurality of light emitting diodes 130. For example, the first alignment key AK1 may have a cross shape, but is not limited thereto.

The second alignment key AK2 may be disposed to overlap the high potential power line VL1 between the plurality of pixel areas UPA. In the high potential power line VL1, a hole overlapping the second alignment key AK2 is formed to divide the second alignment key AK2 and the high potential power line VL1. The second alignment key AK2 may be used to align the display panel PN and a donor. The display panel PN and the donor are aligned using the second alignment key AK2 and the plurality of light emitting diodes 130 of the donor may be transferred onto the display panel PN. For example, the second alignment key AK2 may have a circular ring shape, but is not limited thereto.

Referring to FIG. 4, the pixel circuit for driving the light emitting diode 130 is disposed in each of the plurality of sub pixels SP on the first substrate 110. The pixel circuit may include a plurality of thin film transistors and a plurality of capacitors. In FIGS. 4, for the convenience of description, only a driving transistor DT, a first capacitor C1, and a second capacitor C2, among configurations of the pixel circuit are illustrated. However, the pixel circuit may further include a switching transistor, a sensing transistor, and an emission control transistor, but is not limited thereto.

First, a light shielding layer BSM is disposed on the first substrate 110. The light shielding layer BSM blocks light which is incident to an active layer ACT of the plurality of transistors to minimize a leakage current. For example, the light shielding layer BSM is disposed below the active layer ACT of the driving transistor DT to block light incident onto the active layer ACT. If light is irradiated onto the active layer ACT, leakage current is generated, which deteriorates the reliability of the transistor. Accordingly, the light shielding layer BSM which blocks the light is disposed on the first substrate 110 to improve the reliability of the driving transistor DT. The light shielding layer BSM may be configured by an opaque conductive material such as copper (Cu), aluminum (Al), molybdenum (Mo), nickel (Ni), titanium (Ti), chrome (Cr), or an alloy thereof, but is not limited thereto.

A buffer layer 111 is disposed on the light shielding layer BSM. The buffer layer 111 may reduce permeation of moisture or impurities through the first substrate 110. The buffer layer 111 may be configured by a single layer or a double layer of silicon oxide SiOx or silicon nitride SiNx as an example, but is not limited thereto. However, the buffer layer 111 may be omitted depending on a type of the first substrate 110 or a type of the thin film transistor, but is not limited thereto.

A driving transistor DT including an active layer ACT, a gate electrode GE, a source electrode SE, and a drain electrode DE is disposed on the buffer layer 111.

First, the active layer ACT of the driving transistor DT is disposed on the buffer layer 111. The active layer ACT may be formed of a semiconductor material such as an oxide semiconductor, amorphous silicon, or polysilicon, but is not limited thereto. Further, even though it is not illustrated in the drawing, in addition to the driving transistor DT, other transistors, such as a switching transistor, a sensing transistor, and an emission control transistor may further be disposed. Active layers of the other transistors may be formed of a semiconductor material such as an oxide semiconductor, amorphous silicon, or polysilicon, but is not limited thereto. Further, the active layer of the transistor included in the pixel circuit, such as the driving transistor DT, the switching transistor, the sensing transistor, and the emission control transistor, may be formed of the same material, or formed of different materials from each other.

A gate insulating layer 112 is disposed on the active layer ACT. The gate insulating layer 112 is an insulating layer which electrically insulates the active layer ACT from the gate electrode GE and may be configured by a single layer or a double layer of silicon oxide (SiOx) or silicon nitride (SiNx), but is not limited thereto.

The gate electrode GE is disposed on the gate insulating layer 112. The gate electrode GE may be configured by a conductive material, such as copper (Cu), aluminum (Al), molybdenum (Mo), nickel (Ni), titanium (Ti), chrome (Cr), or an alloy thereof, but is not limited thereto.

A first interlayer insulating layer 113 and a second interlayer insulating layer 114 are disposed on the gate electrode GE. In the first interlayer insulating layer 113 and the second interlayer insulating layer 114, contact holes through which the source electrode SE and the drain electrode DE are connected to the active layer ACT are formed. The first interlayer insulating layer 113 and the second interlayer insulating layer 114 are insulating layers which protect components therebelow and may be configured by single layers or double layers of silicon oxide SiOx or silicon nitride SiNx, but is not limited thereto.

The source electrode SE and the drain electrode DE which are electrically connected to the active layer ACT are disposed on the second interlayer insulating layer 114. The source electrode SE is connected to the second capacitor C2 and the first electrode 134 of the light emitting diode 130 and the drain electrode DE is connected to the other configuration of the pixel circuit. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

Next, the first capacitor C1 is disposed on the gate insulating layer 112. The first capacitor C1 includes a 1-1-th capacitor electrode C1a and a 1-2-th capacitor electrode C1b.

First, the 1-1-th capacitor electrode C1a is disposed on the gate insulating layer 112. The 1-1-th capacitor electrode C1a may be integrally formed with the gate electrode GE of the driving transistor DT.

The 1-2-th capacitor electrode C1b is disposed on the first interlayer insulating layer 113. The 1-2-th capacitor electrode C1b is disposed to overlap the 1-1-th capacitor electrode C1a with the first interlayer insulating layer 113 therebetween.

Therefore, the first capacitor C1 is connected to the gate electrode GE of the driving transistor DT to maintain a voltage of the gate electrode GE of the driving transistor DT for a predetermined period.

Next, the second capacitor C2 is disposed on the first substrate 110. The second capacitor C2 includes a 2-1-th capacitor electrode C2a, a 2-2-th capacitor electrode C2b, and a 2-3-th capacitor electrode C2c. The second capacitor C2 includes the 2-1-th capacitor electrode C2a which is a lower capacitor electrode, the 2-2-th capacitor electrode C2b which is an intermediate capacitor electrode, and the 2-3-th capacitor electrode C2c which is an upper capacitor electrode.

The 2-1-th capacitor electrode C2a is disposed on the first substrate 110. The 2-1-th capacitor electrode C2a is disposed on the same layer as the light shielding layer BSM and may be formed of the same material.

The 2-2-th capacitor electrode C2b is disposed on the buffer layer 111 and the gate insulating layer 112. The 2-2-th capacitor electrode C2b is disposed on the same layer as the gate electrode GE and may be formed of the same material.

The 2-3-th capacitor electrode C2c is disposed on the first interlayer insulating layer 113. The 2-3-th capacitor electrode C2c may be configured by a first layer C2c1 and a second layer C2c2. The first layer C2c1 of the 2-3-th capacitor electrode C2c is formed on the same layer as the 1-2-th capacitor electrode C1b with the same material. The first layer C2c1 may be disposed to overlap the 2-1-th capacitor electrode C2a and the 2-2-th capacitor electrode C2b with the first interlayer insulating layer 113 therebetween.

The second layer C2c2 of the 2-3-th capacitor electrode C2c is disposed on the second interlayer insulating layer 114. The second layer C2c2 is a part extending from the source electrode SE of the driving transistor DT and may be connected to the first layer C2c1 through the contact hole of the second interlayer insulating layer 114.

Accordingly, the second capacitor C2 is electrically connected between the source electrode SE of the driving transistor DT and the light emitting diode 130 to increase capacitance inherent in the light emitting diode 130 and allow the light emitting diode 130 to emit light with a higher luminance.

A first passivation layer 115a is disposed on the driving transistor DT, the first capacitor C1, and the second capacitor C2. The first passivation layer 115a is an insulating layer which protects components below the first passivation layer 115a and may be configured by an inorganic material, such as silicon oxide SiOx or silicon nitride SiNx, but is not limited thereto.

A first planarization layer 116a is disposed on the first passivation layer 115a. The first planarization layer 116a may planarize an upper portion of the pixel circuit including the driving transistor DT. The first planarization layer 116a may be configured by a single layer or a double layer, and for example, configured by benzocyclobutene or an acrylic-based organic material, but is not limited thereto.

The reflection plate RF is disposed on the first planarization layer 116a. The reflection plate RF is a configuration which reflects light emitted from the plurality of light emitting diodes 130 above the first substrate 110 and may be formed with a shape corresponding to each of the plurality of sub pixels SP. One reflection plate RF may be disposed to cover the most area of one sub pixel SP. The reflection plate RF reflects the light emitted from the light emitting diode 130 and may also be used as an electrode which electrically connects the light emitting diode 130 and the pixel circuit. Specifically, the reflection plate RF may be electrically connected to the source electrode SE of the driving transistor DT and the second capacitor C2 through a first contact hole CH1 of the first planarization layer 116a and the first passivation layer 115a. Further, the reflection plate RF may be electrically connected to the first electrode 134 of the light emitting diode 130 through the second connection electrode CE2. Therefore, the reflection plate RF may electrically connect the driving transistor DT and the first electrode 134 of the light emitting diode 130. However, the reflection plate RF may electrically connect the second electrode 135 of the light emitting diode 130 and the high potential power line VL1, instead of connecting the first electrode 134 of the light emitting diode 130 and the driving transistor DT, but is not limited thereto.

The reflection plate RF may include various conductive layers in consideration of a light reflection efficiency and a resistance. For example, the reflection plate RF may use an opaque conductive layer such as silver (Ag), aluminum (Al), molybdenum (Mo), titanium (Ti), or an alloy thereof and a transparent conductive layer such as indium tin oxide, but the structure of the reflection plate RF is not limited thereto.

The second passivation layer 115b is disposed on the reflection plate RF. The second passivation layer 115b is an insulating layer which protects components below the second passivation layer 115b and may be configured by a single layer or a double layer of silicon oxide SiOx or silicon nitride SiNx, but is not limited thereto.

An adhesive layer AD is disposed on the second passivation layer 115b. The adhesive layer AD is formed on the entire surface of the first substrate 110 to fix the light emitting diode 130 disposed on the adhesive layer AD. The adhesive layer AD may be formed of a photo curable adhesive material which is cured by light. For example, the adhesive layer AD may be formed of an acrylic-based material including a photoresist, but is not limited thereto. The adhesive layer AD may be formed on the entire surface of the first substrate 110 excluding pad areas PA1 and PA2 in which the first pad electrode PAD1 is disposed.

The plurality of light emitting diodes 130 is disposed in each of the plurality of sub pixels SP on the adhesive layer AD. The light emitting diode 130 is an element which emits light by a current and may include a red light emitting diode which emits red light, a green light emitting diode which emits green light, and a blue light emitting diode which emits blue light and may implement light with various colors including white by a combination thereof. For example, the light emitting diode 130 may be a light emitting diode (LED) or a micro LED, but is not limited thereto.

The plurality of light emitting diodes 130 includes a first semiconductor layer 131, an emission layer 132, a second semiconductor layer 133, a first electrode 134, and a second electrode 135.

The first semiconductor layer 131 is disposed on the adhesive layer AD and the second semiconductor layer 133 is disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may be layers doped with n-type and p-type impurities into a material such as gallium nitride (GaN), indium aluminum phosphide (InAlP), or gallium arsenide (GaAs). Further, the p-type impurity may be magnesium (Mg), zinc (Zn), and beryllium (Be), and the n-type impurity may be silicon (Si), germanium, and tin (Sn), but are not limited thereto.

The emission layer 132 is disposed between the first semiconductor layer 131 and the second semiconductor layer 133. The emission layer 132 is supplied with holes and electrons from the first semiconductor layer 131 and the second semiconductor layer 133 to emit light. The emission layer 132 may be formed by a single layer or a multi-quantum well (MQW) structure, and for example, may be formed of indium gallium nitride (InGaN) or gallium nitride (GaN), but is not limited thereto.

The first electrode 134 is disposed on the first semiconductor layer 131. The first electrode 134 is an electrode which electrically connects the driving transistor DT and the first semiconductor layer 131. In this case, the first semiconductor layer 131 is a semiconductor layer doped with an n-type impurity and the first electrode 134 may be a cathode. The first electrode 134 may be disposed on a top surface of the first semiconductor layer 131 which is exposed from the emission layer 132 and the second semiconductor layer 133. The first electrode 134 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 135 is disposed on the second semiconductor layer 133. The second electrode 135 may be disposed on the top surface of the second semiconductor layer 133. The second electrode 135 is an electrode which electrically connects the high potential power line VL1 and the second semiconductor layer 133. In this case, the second semiconductor layer 133 is a semiconductor layer doped with a p-type impurity and the second electrode 135 may be an anode. The second electrode 135 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

Next, the encapsulation layer 136 which encloses the first semiconductor layer 131, the emission layer 132, the second semiconductor layer 133, the first electrode 134, and the second electrode 135 is disposed. The encapsulation layer 136 is formed of an insulating material to protect the first semiconductor layer 131, the emission layer 132, and the second semiconductor layer 133. In the encapsulation layer 136, a contact hole which exposes the first electrode 134 and the second electrode 135 is formed to electrically connect a first connection electrode CE1 and a second connection electrode CE2 to the first electrode 134 and the second electrode 135.

In the meantime, a part of the side surface of the first semiconductor layer 131 may be exposed from the encapsulation layer 136. The light emitting diode 130 manufactured on the wafer is separated from the wafer to be transferred onto the display panel PN. However, during the process of separating the light emitting diode 130 from the wafer, a part of the encapsulation layer 136 may be torn. For example, a part of the encapsulation layer 136 which is adjacent to a lower edge of the first semiconductor layer 131 of the light emitting diode 130 is torn during the process of separating the light emitting diode 130 from the wafer. Accordingly, a part of a lower side surface of the first semiconductor layer 131 may be exposed to the outside. However, even though the lower portion of the light emitting diode 130 is exposed from the encapsulation layer 136, the first connection electrode CE1 and the second connection electrode CE2 are formed after forming the second planarization layer 116*b* and the third planarization layer 116*c* which cover the side surface of the first semiconductor layer 131. Accordingly, a short defect may be reduced.

Next, the second planarization layer 116*b* and the third planarization layer 116*c* are disposed on the adhesive layer AD and the light emitting diode 130.

The second planarization layer 116*b* overlaps a part of side surfaces of the plurality of light emitting diodes 130 to fix and protect the plurality of light emitting diodes 130. The second planarization layer 116*b* may be formed using a halftone mask. Therefore, the second planarization layer 116*b* may be formed to have a step.

Specifically, a part of the second planarization layer 116*b* which is relatively adjacent to the light emitting diode 130 is formed to have a smaller thickness and a part which is farther from the light emitting diode 130 is formed to have a larger thickness. A part of the second planarization layer 116*b* which is adjacent to the light emitting diode 130 is disposed to enclose the light emitting diode 130 and also is in contact with a side surface of the light emitting diode 130. In the meantime, a part of the encapsulation layer 136 which protects a side surface of the first semiconductor layer 131 of the light emitting diode 130 may be torn during the process of separating the light emitting diode 130 from the wafer to be transferred onto the display panel PN. At this time, the second planarization layer 116*b* is in contact with a side surface of the light emitting diode 130 so that the second planarization layer 116*b* may cover a torn part of the encapsulation layer 136. By doing this, thereafter, contacts and short defects of the connection electrodes CE1 and CE2 and the first semiconductor layer 131 may be suppressed.

The third planarization layer 116*c* is formed to cover upper portions of the second planarization layer 116*b* and the light emitting diode 130 and a contact hole which exposes the first electrode 134 and the second electrode 135 of the light emitting diode 130 may be formed. The first electrode 134 and the second electrode 135 of the light emitting diode 130 are exposed from the third planarization layer 116*c* and the third planarization layer 116*c* is partially disposed in an area between the first electrode 134 and the second electrode 135 to reduce a short defect. The second planarization layer 116*b* and the third planarization layer 116*c* may be configured by a single layer or a double layer, and for example, may be formed of photoresist or an acrylic-based organic material, but is not limited thereto.

In the meantime, the third planarization layer 116*c* may cover only the light emitting diode 130 and an area adjacent to the light emitting diode 130. The third planarization layer 116*c* is disposed in an area of the sub pixel SP enclosed by the bank BB and may be disposed in an island shape. Therefore, the bank BB is disposed in a part of the top surface of the second planarization layer 116*b* and the third planarization layer 116*c* may be disposed in the other part of the top surface of the second planarization layer 116*b*.

The first connection electrode CE1 and the second connection electrode CE2 are disposed on the third planarization layer 116*c*. The first connection electrode CE1 is an electrode which electrically connects the second electrode 135 of the light emitting diode 130 and the high potential power line VL1. The first connection electrode CE1 may be electrically connected to the second electrode 135 of the light emitting diode 130 through a contact hole formed in the third planarization layer 116*c*.

The second connection electrode CE2 is an electrode which electrically connects the first electrode 134 of the light emitting diode 130 and the driving transistor DT. The second connection electrode CE2 may be connected to the reflection plate RF of each of the plurality of sub pixels SP through contact holes formed in the third planarization layer 116*c*, the second planarization layer 116*b*, the adhesive layer AD, and the second passivation layer 115*b*. At this time, the reflection plate RF is also connected to the source electrode SE of the driving transistor DT so that the source electrode SE of the driving transistor DT and the first electrode 134 of the light emitting diode 130 may be electrically connected to each other.

A bank BB is disposed on the second planarization layer 116*b* exposed from the first connection electrode CE1 and the second connection electrode CE2, and the third planarization layer 116*c*. The bank BB may be disposed to be spaced apart from the light emitting diode 130 with a predetermined interval and may overlap at least partially the reflection plate RF. For example, the bank BB may cover a part of the second connection electrode CE2 formed in the contact holes of the third planarization layer 116*c* and the second planarization layer 116*b*. Further, the bank BB may be disposed on the second planarization layer 116*b* with a predetermined interval from the light emitting diode 130. In this case, the bank BB and the third planarization layer 116*c* may be spaced apart from each other on a part of the second planarization layer 116*b* having a smaller thickness. That is, an end of the bank BB and an end of the third planarization layer 116*c* may be disposed on a part of the second planarization layer 116*b* having a smaller thickness formed by a halftone mask process to be spaced apart from each other.

The bank BB may be formed of an opaque material to reduce color mixture between the plurality of sub pixels SP and for example, may be formed of black resin, but is not limited thereto.

In the meantime, a thickness of a part of the bank BB which is formed in the contact holes of the third planarization layer 116*c* and the second planarization layer 116*b* to cover a part of the second connection electrode CE2 and a thickness of a part disposed on the second planarization layer 116*b* may be different from each other. Specifically, a contact hole in which the second connection electrode CE2 is formed may be formed from the second passivation layer 115*b* to the third planarization layer 116*c*. Therefore, a part of the bank BB which covers a part of the second connection electrode CE2 formed in the contact holes of the third planarization layer 116*c* and the second planarization layer 116*b* may be disposed below the light emitting diode 130, that is, to be lower than the light emitting diode 130. Therefore, the thickness of the part of the bank BB which covers a part of the second connection electrode CE2 formed in the contact holes of the third planarization layer 116*c* and the second planarization layer 116*b* may be larger than the thickness of a part of the bank BB disposed on the second planarization layer 116*b*.

A first protection layer 117 is disposed on the first connection electrode CE1, the second connection electrode CE2, and the bank BB. The first protection layer 117 is a layer for protecting components below the first protection layer 117, and may be configured by a single layer or a double layer of translucent epoxy, silicon oxide SiOx or silicon nitride SiNx, but is not limited thereto.

A plurality of first pad electrodes PAD1 is disposed in a first pad area PA1 and a second pad area PA2 of the first substrate 110. Each of the plurality of first pad electrodes PAD1 may be configured by a plurality of conductive layers. For example, each of the plurality of first pad electrodes PAD1 includes a first conductive layer PE1*a*, a second conductive layer PE1*b*, and a third conductive layer PE1*c*.

First, the first conductive layer PE1*a* is disposed on the second interlayer insulating layer 114. The first conductive layer PE1*a* may be formed of the same conductive material as the source electrode SE and the drain electrode DE and for example, may be configured by copper (Cu), aluminum (Al), molybdenum (Mo), nickel (Ni), titanium (Ti), chrome (Cr), or an alloy thereof, but is not limited thereto.

The first passivation layer 115*a* is disposed on the first conductive layer PE1*a* and the second conductive layer PE1*b* is disposed on the first passivation layer 115*a*. The second conductive layer PE1*b* may be formed of the same conductive material as the reflection plate RF and for example, may be configured by silver (Ag), aluminum (Al), molybdenum (Mo), or an alloy thereof, but is not limited thereto.

The third conductive layer PE1*c* is disposed on the second conductive layer PE1*b*. The third conductive layer PE1*c* is formed of the same conductive material as the first connection electrode CE1 and the second connection electrode CE2, and for example, a transparent conductive material, such as indium tin oxide (ITO) or indium zinc oxide (IZO), but is not limited thereto.

At this time, even though it is not illustrated in the drawings, a part of the plurality of conductive layers of the first pad electrode PAD1 is electrically connected to a plurality of wiring lines on the first substrate 110 to supply various signals to a plurality of wiring lines and a plurality of sub pixels SP. For example, the first conductive layer PE1*a* and/or the second conductive layer PE1*b* of the first pad electrode PAD1 is connected to the data line DL, the high potential power line VL1, and the low potential power line VL2 disposed in the active area AA to transmit signals thereto.

Further, a first metal layer ML1, a second metal layer ML2, and a plurality of insulating layers may be disposed together below the first pad electrode PAD1. The first metal layer ML1, the second metal layer ML2, and the plurality of insulating layers are disposed below the first pad electrode PAD1 to adjust a step of the first pad electrode PAD1. For example, the buffer layer 111, the gate insulating layer 112, the first metal layer ML1, the first interlayer insulating layer 113, and the second metal layer ML2 may sequentially be disposed between the first pad electrode PAD1 and the first substrate 110. The first metal layer ML1 is formed of the same conductive material as the gate electrode GE and the second metal layer ML2 may be formed of the same conductive material as the 1-2-th capacitor electrode C1*b*. However, the plurality of insulating layers, the first metal layer, and the second metal layer below the first pad electrode PAD1 may be omitted depending on a design and are not limited thereto.

A second substrate 120 is disposed below the first substrate 110. The second substrate 120 is a substrate which supports components disposed below the display device 100 and may be an insulating substrate. For example, the second substrate 120 may be formed of glass or resin. Further, the second substrate 120 may include polymer or plastic. The second substrate 120 may be formed of the same material as the first substrate 110. In some exemplary embodiments, the second substrate 120 may be formed of a plastic material having flexibility.

A bonding layer BDL is disposed between the first substrate 110 and the second substrate 120. The bonding layer BDL may be formed of a material which is cured by various curing methods to bond the first substrate 110 and the second substrate 120. The bonding layer BDL may be disposed only in a partial area between the first substrate 110 and the second substrate 120 or may be disposed in the entire area therebetween.

A plurality of second pad electrodes PAD2 is disposed on a rear surface of the second substrate 120. The plurality of second pad electrodes PAD2 is electrodes which transmit a signal from a driving component disposed on the rear surface of the second substrate 120 to a plurality of side lines SRL and a plurality of first pad electrodes PAD1 and a plurality of wiring lines on the first substrate 110. The plurality of second pad electrodes PAD2 is disposed in an end portion of the second substrate 120 in the non-active area NA to be electrically connected to the side line SRL which covers the end portion of the second substrate 120.

At this time, the plurality of second pad electrodes PAD2 may also be disposed so as to correspond to the plurality of pad areas PA1 and PA2. The plurality of first pad electrodes PAD1 may be disposed to correspond to the plurality of second pad electrodes PAD2, respectively, and then the first pad electrode PAD1 and the second pad electrode PAD2 which overlap each other may be electrically connected through the side line SRL.

Each of the plurality of second pad electrodes PAD2 includes a plurality of conductive layers. For example, each of the plurality of second pad electrodes PAD2 includes a fourth conductive layer PE2*a*, a fifth conductive layer PE2*b*, and a sixth conductive layer PE2*c*.

First, the fourth conductive layer PE2*a* is disposed below the second substrate 120. The fourth conductive layer PE2*a* may be configured by a conductive material such as copper (Cu), aluminum (Al), molybdenum (Mo), nickel (Ni), titanium (Ti), chrome (Cr), or an alloy thereof, but is not limited thereto.

The fifth conductive layer PE2*b* is disposed below the fourth conductive layer PE2*a*. The fifth conductive layer PE2*b* may be configured by a conductive material, such as copper (Cu), aluminum (Al), molybdenum (Mo), nickel (Ni), titanium (Ti), chrome (Cr), or an alloy thereof, but is not limited thereto.

The sixth conductive layer PE2*c* is disposed below the fifth conductive layer PE2*b*. The sixth conductive layer PE2*c* may be formed of a conductive material, for example, a transparent conductive material, such as indium tin oxide (ITO) or indium zinc oxide (IZO), but is not limited thereto.

Further, the second protection layer 121 is disposed in the remaining area of the second substrate 120. The second protection layer 121 may protect various wiring lines and driving components formed on the second substrate 120. The second protection layer 121 may be configured by an organic insulating material, and for example, configured by benzocyclobutene or an acrylic-based organic insulating material, but is not limited thereto.

In the meantime, even though it is not illustrated in the drawing, a driving component including a plurality of flexible films and a printed circuit board may be disposed on a rear surface of the second substrate 120. The plurality of flexible films is components in which various components such as a data driver IC are disposed on a base film having a ductility to supply signals to the plurality of sub pixels SP. The printed circuit board is a component which is electrically connected to the plurality of flexible films to supply signals to the driving IC. On the printed circuit board, various components for supplying various signals to the driving IC may be disposed.

For example, the fourth conductive layer PE2*a* and/or the fifth conductive layer PE2*b* of the second pad electrode PAD2 extends to the plurality of flexible films disposed on the rear surface of the second substrate 120 to be electrically connected to the plurality of flexible films. The plurality of flexible films may supply various signals to the plurality of side lines SRL, the plurality of first pad electrodes PAD1, the plurality of wiring lines, and the plurality of sub pixels SP through the second pad electrode PAD2. Therefore, the signal from the driving component may be transmitted to the signal line and the plurality of sub pixels SP on the front surface of the first substrate 110 through the plurality of second pad electrodes PAD2 of the second substrate 120, the side line SRL, and the plurality of first pad electrodes PAD1 of the first substrate 110.

Next, the plurality of side lines SRL is disposed on the side surfaces of the first substrate 110 and the second substrate 120. The plurality of side lines SRL may electrically connect the plurality of first pad electrodes PAD1 formed on the top surface of the first substrate 110 and the plurality of second pad electrodes PAD2 formed on the rear surface of the second substrate 120. The plurality of side lines SRL may be disposed so as to enclose the side surface of the display device 100. Each of the plurality of side lines SRL may cover the first pad electrode PAD1 at an end portion of the first substrate 110, a side surface of the first substrate 110, a side surface of the second substrate 120, and the second pad electrode PAD2 at an end portion of the second substrate 120. For example, the plurality of side lines SRL may be formed by a pad printing method using a conductive ink including silver (Ag), copper (Cu), molybdenum (Mo), and chrome (Cr).

A side insulating layer 140 which covers the plurality of side lines SRL is disposed. The side insulating layer 140 may be formed on the top surface of the first substrate 110, the side surface of the first substrate 110, the side surface of the second substrate 120, and the rear surface of the second substrate 120 to cover the side line SRL. The side insulating layer 140 may protect the plurality of side lines SRL.

In the meantime, when the plurality of side lines SRL is formed of a metal material, there may be a problem in that external light is reflected from the plurality of side lines SRL or light emitted from the light emitting diode 130 is reflected from the plurality of side lines SRL to be visibly recognized by the user. Therefore, the side insulating layer 140 is configured to include a black material to suppress reflection of the external light. For example, the side insulating layer 140 may be formed by a pad printing method using an insulating material including a black material, for example, a black ink.

A seal member 150 which covers the side insulating layer 140 is disposed. The seal member 150 is disposed so as to enclose the side surface of the display device 100 to protect the display device 100 from external impacts, moisture, and oxygen. For example, the seal member 150 may be formed of polyimide (PI), poly urethane, epoxy, or acryl-based insulating material, but is not limited thereto.

An optical film MF is disposed on the seal member 150, the side insulating layer 140, and the first protection layer 117. The optical film MF may be a functional film which implements a higher quality of images while protecting the display device 100. For example, the optical film MF may include an anti-scattering film, an anti-glare film, an anti-reflecting film, a low-reflecting film, an OLED transmittance controllable film, or a polarizer, but is not limited thereto.

In the meantime, an edge of the seal member 150 and an edge of the optical film MF may be disposed on the same line. The optical film MF having a larger size is attached above the first substrate 110 during the manufacturing process of the display device 100 and the seal member 150 which covers the side insulating layer 140 may be formed. Thereafter, laser is irradiated on the seal member 150 and the optical film MF so as to correspond to an edge of the display device 100 to cut a part of the seal member 150 and the optical film MF. Accordingly, the size of the display device 100 is adjusted by an outer periphery cutting process of the seal member 150 and the optical film MF and the edge of the display device 100 may be formed to be flat.

Hereinafter, a mechanical structure of the display device 100 according to the exemplary embodiment of the present disclosure will be described with reference to FIGS. 5 to 9.

Figure 5:
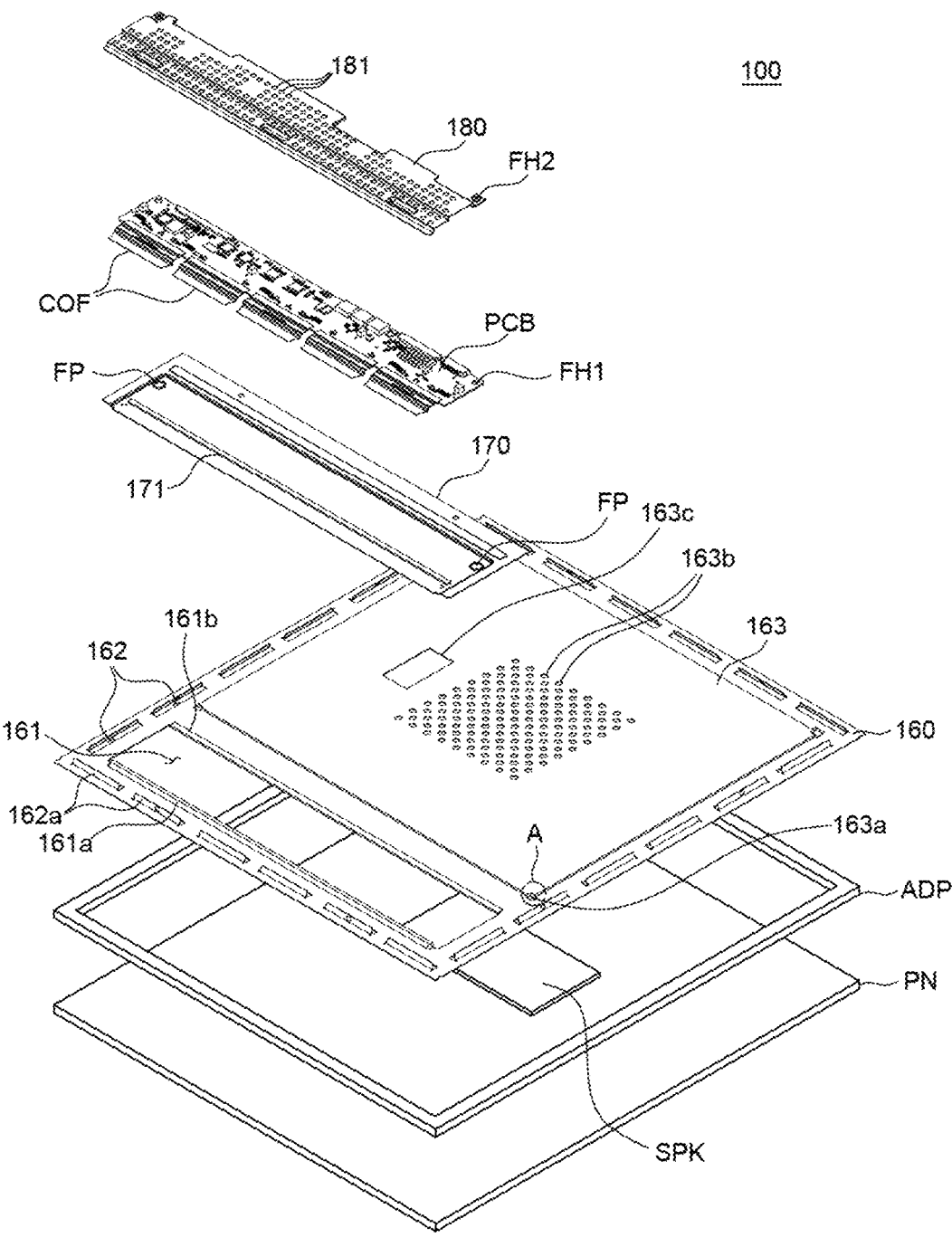
FIG. 5 is an exploded perspective view of a display device according to an exemplary embodiment of the present disclosure.
Figure 6:
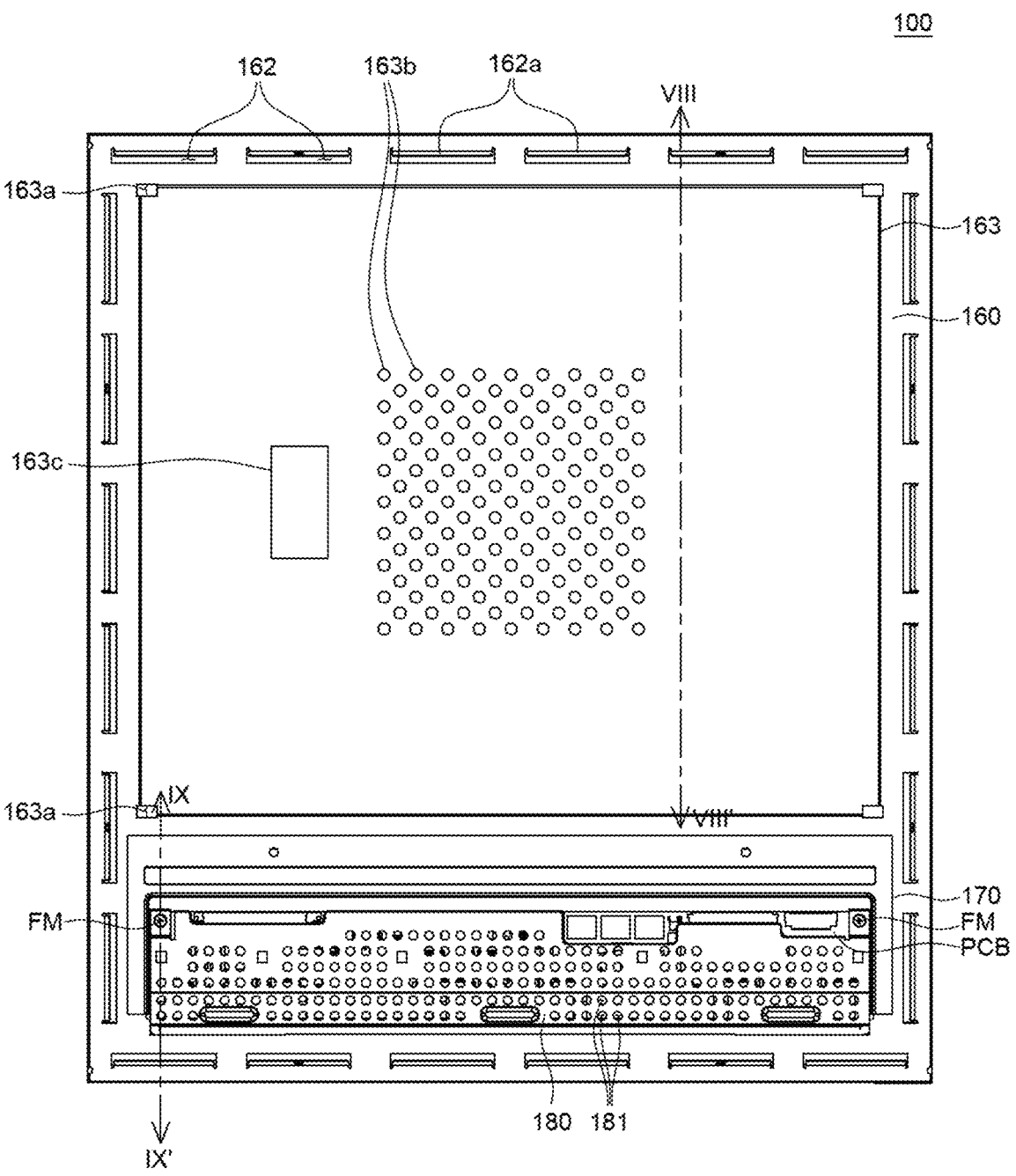
FIG. 6 is a rear view of a display device according to an exemplary embodiment of the present disclosure.
Figure 7:
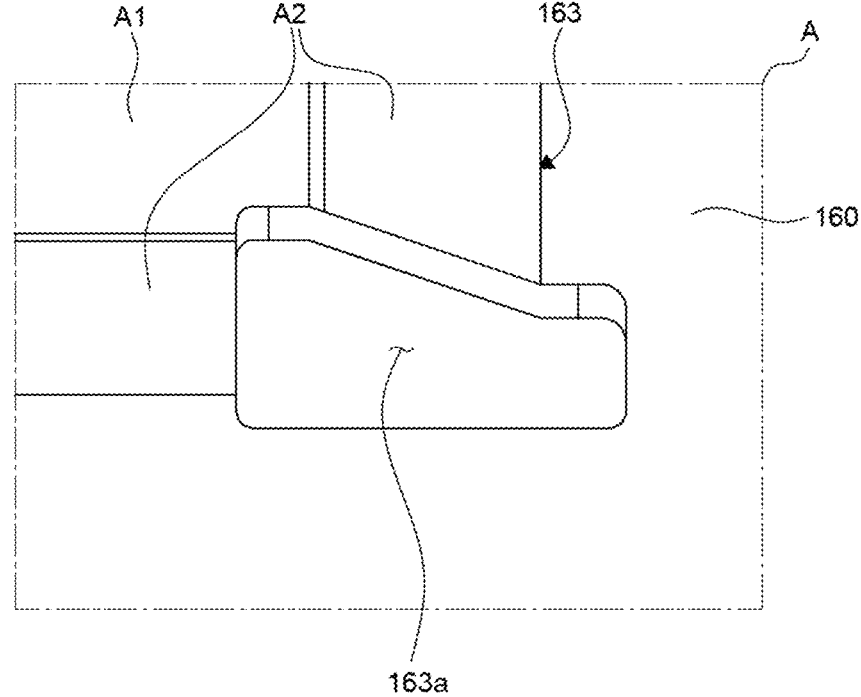
FIG. 7 is an example of an enlarged perspective view of a portion A of FIG. 5.
Figure 8:
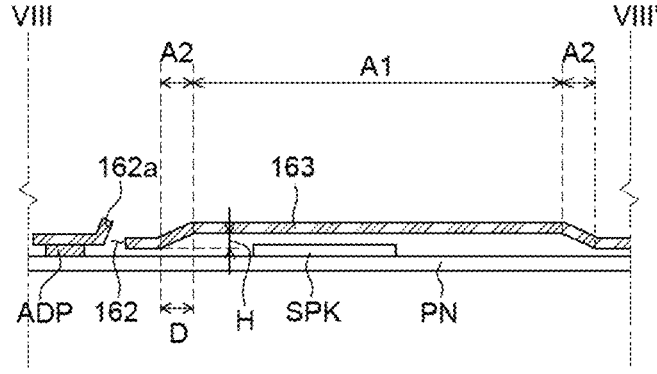
FIG. 8 is an example of a cross-sectional view taken along the line VIII-VIII' of FIG. 6.
Figure 9:
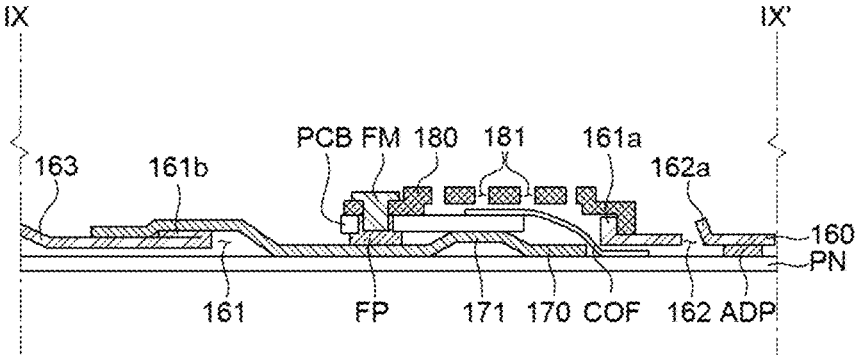
FIG. 9 is an example of a cross-sectional view taken along IX-IX' of FIG. 6.

FIG. 5 is an exploded perspective view of a display device according to an exemplary embodiment of the present disclosure. FIG. 6 is a rear view of a display device according to an exemplary embodiment of the present disclosure. FIG. 7 is an example of an enlarged perspective view of a portion A of FIG. 5. FIG. 8 is an example of a cross-sectional view taken along the line VIII-VIII' of FIG. 6. FIG. 9 is an example of a cross-sectional view taken along IX-IX' of FIG. 6.

Referring to FIGS. 5 to 8, the display device 100 according to the exemplary embodiment of the present disclosure includes a display panel PN, a speaker SPK, a plurality of flexible films COF, a printed circuit board PCB, a cover bottom 160, a plate bottom 170, a cover shield 180, and an adhesive member ADP.

The speaker SPK is disposed on a rear surface of the display panel PN. The speaker SPK may be attached onto the rear surface of the display panel PN. Specifically, the speaker SPK may be disposed so as to correspond to a forming unit 163 of the cover bottom 160 to be described below. Further, the speaker SPK may be disposed to be spaced apart from the plurality of flexible films COF and the printed circuit board PCB to be described below. The speaker SPK is configured to output a sound through the display panel PN. For example, a vibration of an audible frequency output from the speaker SPK vibrates the display panel PN which is attached to the speaker SPK and a sound is provided to the user through the vibration of the display panel PN. The speaker SPK may be a film type speaker which uses the display panel PN as a diaphragm and may be an actuator or an exciter, but it is not limited thereto and also may be an audio device which outputs a sound in accordance with an electrical signal.

The plurality of flexible films COF is bonded onto the rear surface of the display panel PN. The plurality of flexible films COF may be electrically connected to the plurality of second pad electrodes PAD2 of the second substrate 120 of the display panel PN. The flexible film COF is a film in which various components are disposed on a base film having a ductility to supply a signal to the sub pixel SP and a driving component and may be electrically connected to the display panel PN.

A driving IC such as a gate driver IC or a data driver IC may be disposed on the plurality of flexible films COF. The driving IC is a component which processes data for displaying images and a driving signal for processing the data. The driving IC may be disposed in a chip on glass (COG), a chip on film (COF), or a tape carrier package (TCP) manner depending on a mounting method. However, for the convenience of description, it is described that the driving IC is mounted on the plurality of flexible films COF by a chip on film technique, but is not limited thereto.

The printed circuit board PCB is electrically connected to the plurality of flexible films COF. The printed circuit board PCB is a component which supplies signals to the driving IC. On the printed circuit board PCB, various components for supplying various signals to the driving IC may be disposed.

In the meantime, even though in FIG. 5, it is illustrated that five flexible films COF and one printed circuit board PCB are provided, the number of the plurality of flexible films COF and printed circuit boards PCB may vary depending on a design, but is not limited thereto.

The printed circuit board PCB includes a first fastening hole FH1. A fastening member FM is inserted into the first fastening hole FH1 formed in the printed circuit board PCB so that the printed circuit board PCB and the plate bottom 170 and the cover shield 180 are fastened with each other.

The cover bottom 160 is disposed on the rear surface of the display panel PN. The cover bottom 160 may be disposed between the display panel PN and the printed circuit board PCB. The cover bottom 160 may support and protect the display panel PN on the rear surface of the display panel PN. The cover bottom 160 is formed to have a shape corresponding to a planar shape of the display panel PN to cover the display panel PN. The cover bottom 160 may be formed of a material having a rigidity and a high thermal conductivity and for example, is formed of a metal material such as aluminum (Al), copper (Cu), zinc (Zn), silver (Ag), gold (Au), iron (Fe), steel use stainless (SUS), or invar, or a plastic material.

The cover bottom 160 includes a first opening 161, a plurality of second openings 162, and the forming unit 163.

The first opening 161 of the cover bottom 160 may be disposed so as to correspond to the plurality of flexible films COF and the printed circuit board PCB. The first opening 161 may be located on an area of the display panel PN to which the plurality of flexible films COF is bonded. For example, the plurality of flexible films COF is bonded to an area adjacent to one edge of the display panel PN and the first opening 161 may also be formed so as to correspond to an area adjacent to one edge of the display panel PN.

Further, the plurality of flexible films COF and the printed circuit board PCB pass through the first opening 161 to be disposed on the rear surface of the cover bottom 160. Therefore, the plurality of flexible films COF and the printed circuit board PCB may be disposed on the cover bottom 160 without preparing a separate area for disposing the plurality of flexible films COF and the printed circuit board PCB between the cover bottom 160 and the display panel PN. At this time, the plate bottom 170 is seated in the first opening 161 of the cover bottom 160 to support the printed circuit board PCB, which will be described in more detail below.

A first protrusion 161a and a hemming unit 161b are disposed at an edge of the first opening 161. The first protrusion 161a may be disposed at one edge adjacent to one edge of the display panel PN, among edges of the first opening 161.

The first protrusion 161a may be disposed at an edge most adjacent to a lower edge of the display panel PN, among edges of the first opening 161. The first protrusion 161a may be disposed to protrude toward a direction perpendicular to the rear surface of the cover bottom 160 from one edge of the first opening 161. The first protrusion 161a is engaged with the cover shield 180 to be described below to restrict the movement of the cover shield 180 and guide a position of the cover shield 180.

The hemming unit 161b may be disposed at the other edge of the first opening 161 which is opposite to one edge. The hemming unit 161b may be opposite to the first protrusion 161a with the first opening 161 therebetween. The hemming unit 161b is a part formed by bending a part of the other edge of the first opening 161 toward the outside of the first opening 161.

For example, the other edge of the first opening 161 in which the hemming unit 161b is formed may have a "⊏" shaped cross-section. The hemming unit 161b disposed on the other edge of the first opening 161 may minimize the bending of the cover bottom 160 when the cover bottom 160 is formed. The hemming unit 161b is a part formed by bending a part of the cover bottom 160 so that the hemming unit may have a rigidity larger than the other part of the cover bottom 160 and the bending of the cover bottom 160 may be minimized by the hemming unit 161b.

Next, the plurality of second openings 162 of the cover bottom 160 is disposed along an edge of the cover bottom 160.

The plurality of second openings 162 may be disposed to be parallel to the edge of the cover bottom 160. The plurality of second openings 162 is openings formed when the plurality of second protrusions 162a is formed.

The plurality of second protrusions 162a is parts which couple the display device 100 to a cabinet. The plurality of second protrusions 162a is used to fix the display device 100 to the cabinet in the form of a tile to form a tiling display device TD. The plurality of second protrusions 162a are parts which protrudes from one edges of the plurality of second openings 162 onto the rear surface of the cover bottom 160. The plurality of second protrusions 162a is formed by bending a part of the cover bottom 160 in a direction perpendicular to the rear surface of the cover bottom 160 and has an L-shaped cross-section.

The plurality of second protrusion 162a may be formed by cutting and bending a part of the cover bottom 160. Therefore, when the plurality of second protrusions 162a is formed, the plurality of second openings 162 mat be formed in a part in which the cover bottom 160 is cut. Therefore, the plurality of second protrusions 162a may be disposed on the edges of the plurality of second openings 162. For example, the plurality of second protrusion 162a may be disposed on an edge of the plurality of second opening 162 which is parallel to an edge of the cover bottom 160.

The forming unit 163 of the cover bottom 160 is a convexly protruding portion of the cover bottom 160. The forming unit 163 may be disposed in a remaining area excluding an area in which the first opening 161 and the plurality of second openings 162 are formed. That is, the forming unit 163 is spaced apart from the first opening 161 and the plurality of second opening units 162 and may be disposed to be enclosed by the first opening 161 and the plurality of second openings 162. The forming unit 163 may overlap most of the remaining area excluding an area in which the plurality of flexible films COF and the printed circuit board PCB is disposed, from the area of the display panel PN.

The forming unit 163 may be disposed to protrude toward a direction perpendicular to the rear surface of the display panel PN. The forming unit 163 may be disposed to be farther from the display panel PN than the remaining part of the cover bottom 160 excluding the forming unit 163. In the forming unit 163, an interval between the cover bottom 160 and the display panel PN is larger than an interval between the cover bottom 160 and the display panel PN at the edge of the cover bottom 160. Therefore, an empty space may be formed between the forming unit 163 and the display panel PN and air circulates in the empty space to reduce the entire temperature deviation of the display panel PN.

The forming unit 163 may correspond to the speaker SPK. Specifically, the forming unit 163 may be configured to accommodate the speaker SPK. That is, the speaker SPK may be accommodated in the empty space between the forming unit 163 which is formed when the forming unit 163 protrudes and the display panel PN. Therefore, the speaker SPK may be disposed between the forming unit 163 of the cover bottom 160 and the display panel PN. Further, the empty space between the forming unit 163 and the display panel PN may serve as an enclosure of the speaker SPK. That is, the forming unit 163 is formed in the cover bottom 160 so that an enclosure is implemented without causing complex structure changing to improve a sound quality.

The forming unit 163 includes a first area A1 and a second area A2. Specifically, referring to FIGS. 7 and 8, the first area A1 is disposed in the middle of the forming unit 163 and the second area A2 may be disposed at an outer periphery of the forming unit 163. The first area A1 occupies most of the forming unit 163 and may be a flat area. Further, the first area A1 may be parallel to the display panel PN. The second area A2 is an area which connects an area of the cover bottom 160 excluding the forming unit 163 and the first area A1 and may be an inclined area. That is, the second area A2 may connect the remaining area of the cover bottom 160 at the outer periphery of the forming unit 163 and the first area A1.

A width D of the second area A2 may be configured to be larger than a height H of the second area A2. For example, a ratio of the width D of the second area A2 and the height H of the second area A2 may be 2:1 or larger, but is not limited thereto. Further, the height H of the second area A2 may be approximately 1 mm, but is not limited thereto. If the width D of the second area A2 is equal to the height H of the second area A2, a flatness of the forming unit 163 may be degraded.

Therefore, the ratio of the width D of the second area A2 and the height H of the second area A2 is configured to be 2:1 or larger, so that the flatness of the forming unit 163 may be improved. Further, the flatness of the forming unit 163 is improved to easily drive the speaker SPK and implement the enclosure of the forming unit 163. In the meantime, the width D of the second area A2 is a length in a direction parallel to the display panel PN and the height H of the second area A2 is a length in a direction perpendicular to the display panel PN.

The forming unit 163 includes a plurality of corner holes 163a, a plurality of heat dissipation holes 163b, and a cable hole 163c.

The plurality of corner holes 163a of the forming unit 163 is disposed at the corner of the forming unit 163. For example, the forming unit 163 may protrude in a substantially square shape and the corner holes 163a may be formed at four corners of the forming unit 163. The plurality of corner holes 163a may be formed to pass through the cover bottom 160. The plurality of corner holes 163a may be formed in a part of the first area A1, a part of the second area A2, and a part of the cover bottom 160 at the outer periphery of the forming unit 163 which correspond to the corners of the forming unit 163, but is not limited thereto. As illustrated in FIGS. 6 and 7, a planar shape of the plurality of corner holes 163a may be a rectangular shape, but is not limited thereto. The plurality of corner holes 163a relieves a stress concentrated on the corners of the forming unit 163 and may improve the flatness of the forming unit 163.

The plurality of heat dissipation holes 163b of the forming unit 163 is disposed in the middle of the forming unit 163. Specifically, the plurality of heat dissipation holes 163b may be disposed in the middle of the first area A1 of the forming unit 163, but is not limited thereto. The plurality of heat dissipation holes 163b may dissipate the heat generated in the printed circuit board PCB and the display panel PN to the outside of the cover bottom 160.

A cable hole 163c of the forming unit 163 is disposed in the first area A1 of the forming unit 163. The cable hole 163c may be spaced apart from the plurality of heat dissipation holes 163b. The cable hole 163c may be a hole through which a cable connected to the speaker SPK passes. For example, the cable extending from the speaker SPK may electrically connect the speaker SPK and the printed circuit board PCB through the cable hole 163c. Therefore, the speaker SPK may be driven by a signal output from the printed circuit board PCB. In FIGS. 5 and 6, one cable hole 163c is disposed to be adjacent to the plurality of heat dissipation holes 163b, but the number and the position of cable holes 163c are not limited thereto.

The plate bottom 170 is disposed between the printed circuit board PCB and the first opening 161 of the cover bottom 160. A part of the plate bottom 170 covers the other edge of the first opening 161 and the cover bottom 160 and the other part of the plate bottom 170 may be disposed in the first opening 161. The plate bottom 170 passes through the first opening 161 to support the printed circuit board PCB disposed on the cover bottom 160. At this time, an area of the display panel PN to which one ends of the plurality of flexible films COF are bonded may be a partial area of the first opening 161 which does not overlap the plate bottom 170. One ends of the plurality of flexible films COF overlap the first opening 161 and may be disposed to be spaced apart from the plate bottom 170.

The plate bottom 170 may disperse and dissipate the heat generated in the printed circuit board PCB. Further, the plate bottom 170 does not allow the printed circuit board PCB to be in direct contact with the display panel PN to minimize the concentration of the heat of the printed circuit board PCB on a specific area of the display panel PN.

Specifically, the printed circuit board PCB includes a plurality of components and among them, some driving chips which generate a lot of heat may be disposed. For example, the printed circuit board PCB includes a power management integrated circuit (PMIC) which generates various power voltages so that in the PMIC, a lot of heat may be generated. Specifically, the PMIC includes a field effect transistor (FET) and a buck IC which are ICs for generating a high potential power voltage and a large amount of heat may be generated, but is not limited thereto. The plate bottom 170 disperses the heat generated in some driving chips of the printed circuit board PCB to the entire plate bottom 170 so as not to concentrate the heat on a partial area of the display panel PN adjacent to the driving chip and reduce the entire temperature deviation of the display panel PN.

The plate bottom 170 includes a bead 171. The bead 171 is a part protruding from one surface of the plate bottom 170 toward the printed circuit board PCB and may improve the rigidity of the plate bottom 170 while supporting the printed circuit board PCB. The bead 171 may be in direct contact with the printed circuit board PCB and heat generated in the printed circuit board PCB may be dispersed to the entire plate bottom 170 through the bead 171.

The plate bottom 170 includes a fastening unit FP. The fastening unit FP is a part to which the fastening member FM passing through the first fastening hole FH1 of the printed circuit board PCB and the second fastening hole FH2 of the cover shield 180 is coupled. The fastening member FM is coupled to the fastening unit FP to fix the plate bottom 170, the printed circuit board PCB, and the cover shield 180 to each other. For example, the fastening unit FP may be a Pem-nut having a groove with a thread of a screw therein, but is not limited thereto.

Next, a cover shield 180 is disposed on the cover bottom 160, the plate bottom 170, and the printed circuit board PCB. The cover shield 180 may protect the printed circuit board PCB from the external impact. The cover shield 180 is formed of a material having a rigidity to protect the printed circuit board PCB, but is not limited thereto.

The cover shield 180 may be disposed on the rear surface of the cover bottom 160 to cover the printed circuit board PCB. One edge of the cover shield 180 is bent toward the cover bottom 160 to be in contact with the outer surface of the first protrusion 161*a*. For example, one edge of the cover shield 180 is bent in a "¬" shape and may be in contact with an outer surface of the first protrusion 161*a* of the cover bottom 160. Therefore, the first protrusion 161*a* and one side portion of the cover shield 180 are engaged with each other to restrict the movement of the cover shield 180 and guide the position of the cover shield 180.

The cover shield 180 includes a plurality of heat dissipation holes 181. The plurality of heat dissipation holes 181 may be disposed in the most area of the cover shield 180. The plurality of heat dissipation holes 181 is formed to dissipate the heat generated in the printed circuit board PCB to the outside of the cover shield 180. Further, some driving chips which generate a lot of heat, among the plurality of components of the printed circuit board PCB, may be exposed from the cover shield 180. Some driving chips which generate a lot of heat are exposed from the cover shield 180 to efficiently dissipate heat generated in the driving chips. Therefore, an additional groove or hole may be formed in a part of the cover shield 180 according to a position of the driving chip which generates a lot of heat.

The cover shield 180 includes a plurality of second fastening holes FH2. A fastening member FM is inserted into the second fastening hole FH2 to fix the cover shield 180 to the printed circuit board PCB and the plate bottom 170. Specifically, the cover shield 180 and the printed circuit board PCB may be fixed to the plate bottom 170 by coupling the fastening member FM which passes through both the second fastening hole FH2 of the cover shield 180 and the first fastening hole FH1 of the printed circuit board PCB to the fastening unit FP of the plate bottom 170. For example, the fastening member FM may be a bolt which is screwed to the fastening unit FP which is a nut, but is not limited thereto.

Next, an adhesive member ADP is disposed between the cover bottom 160 and the display panel PN. The adhesive member ADP may be formed of a material with adhesiveness to fix the cover bottom 160 onto the rear surface of the display panel PN. The adhesive member ADP may be disposed along an edge of the display panel PN and an edge of the cover bottom 160. The adhesive member ADP may be formed in a frame shape corresponding to an edge of the display panel PN. For example, the adhesive member ADP may be a foam tape having adhesiveness, but is not limited thereto.

In a display device including a speaker, the speaker may be attached onto the rear surface of the display panel. Therefore, in order to ensure the space for the speaker, a thickness of an adhesive tape between the display panel and the cover bottom may be formed to be large. Further, a gap pad which encloses the speaker is disposed between the display panel and the cover bottom to implement the enclosure of the speaker. At this time, the thickness of the gap pad may be configured to be similar to the thickness of the adhesive tape.

In the meantime, when a gap between the display panel and the cover bottom is increased simply by means of the adhesive tape which is attached to the outer periphery of the display panel, the rigidity of the display device may be degraded.

Therefore, the thickness of the cover bottom may be increased to ensure the rigidity, but there is a disadvantage in that the entire thickness of the display device is increased. Further, as the gap between the display panel and the cover bottom is increased, the heat dissipation function through the cover bottom may be degraded. That is, heat of the display panel is not smoothly dispersed through the cover bottom and specifically, the temperature is increased in a lower end portion of the display panel corresponding to the printed circuit board, which causes the temperature deviation in the display panel. Further, there is a limit to increasing the thickness of the adhesive tape so that it is difficult to ensure the space for the enclosure simply using the thickness of the gap pad. Therefore, it is difficult to ensure a rich sound quality.

The display device 100 according to the exemplary embodiment of the present disclosure may ensure an accommodation space of the speaker SPK by changing a shape of the cover bottom 160. Specifically, the cover bottom 160 may include the forming unit 163 protruding in a direction perpendicular to the rear surface of the display panel PN. Further, the speaker SPK may be attached onto the rear surface of the display panel PN between the forming unit 163 and the display panel PN. Therefore, the accommodation space of the speaker SPK is formed by the cover bottom 160 itself so that it is not necessary to change the thickness of the cover bottom 160 to ensure the rigidity. Further, the thickness caused by protruding the forming unit 163 may not be larger than a thickness caused by the thickness of the components disposed on the rear surface of the cover bottom 160 or by protruding the plurality of second protrusions 162*a*. Accordingly, a display device 100 which includes the speaker SPK may be implemented while constantly maintaining the entire thickness of the display device 100.

The forming unit 163 may serve as both the accommodation space of the speaker SPK and the enclosure. That is, the empty space between the forming unit 163 and the display panel PN may serve as an enclosure of the speaker SPK. Accordingly, a separate gap pad for implementing the enclosure may be omitted. Further, the enclosure is implemented by the forming unit 163 which is a part of the cover bottom 160 so that a sufficient gap for the enclosure may be ensured. Accordingly, the rich sound quality may be ensured to improve the sound quality of the display device 100.

In the display device 100 according to the exemplary embodiment of the present disclosure, the accommodation space and the enclosure of the speaker SPK are formed using the cover bottom 160 so that the material cost may be saved. That is, the thicknesses of the adhesive member ADP and the cover bottom 160 do not need to be increased and the gap pad may be omitted. Therefore, a manufacturing cost of the display device 100 may be saved.

In the forming unit 163, a gap between the cover bottom 160 and the display panel PN is increased and a gap between the cover bottom 160 and the display panel PN in the remaining area of the cover bottom 160 excluding the forming unit 163 may be maintained to be relatively small. At this time, the forming unit 163 is formed so as not to overlap the printed circuit board PCB in a position spaced apart from the printed circuit board PCB. In other words, in an area corresponding to the printed circuit board PCB, a gap between the cover bottom 160 and the display panel PN is smaller than in an area corresponding to the forming unit 163. Therefore, even though the forming unit 163 is formed in the cover bottom 160, the heat of the display panel PN may be easily transmitted to the cover bottom 160 through the remaining area of the cover bottom 160.

Accordingly, the heat is easily dispersed and escaped through the cover bottom 160 so that the heat dissipation efficiency may be increased.

The forming unit 163 may reduce the temperature deviation of the display panel PN. Specifically, the air in the display device 100 may circulate through the empty space between the forming unit 163 and the display panel PN. Therefore, heat generated in the printed circuit board PCB disposed in a lower end area of the display panel PN may be uniformly dispersed to the intermediate area and the upper end area of the display panel PN. Accordingly, the temperature may be uniformly implemented in the overall display panel PN. Further, the recognition of the spots or the color difference in the display panel PN may be suppressed by the reduction in the temperature deviation of the display panel PN. Specifically, the cover bottom 160 is formed of a material having a high thermal conductivity. Therefore, the heat dispersed in the empty space between the forming unit 163 and the display panel PN is dispersed and escaped through the cover bottom 160 so that the heat dissipation efficiency may be increased.

Hereinafter, an effect of reducing a temperature deviation of a display panel by a forming unit will be described with reference to FIGS. 10A to 11.

Figure 10A:
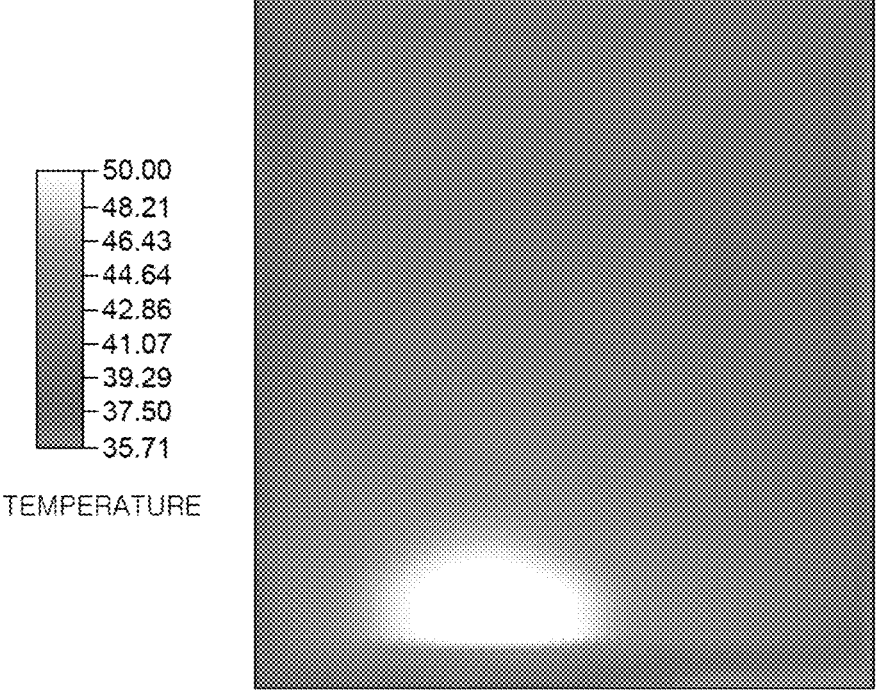
FIG. 10A is a temperature measurement result of a display device according to an exemplary embodiment of the present disclosure.
Figure 10B:
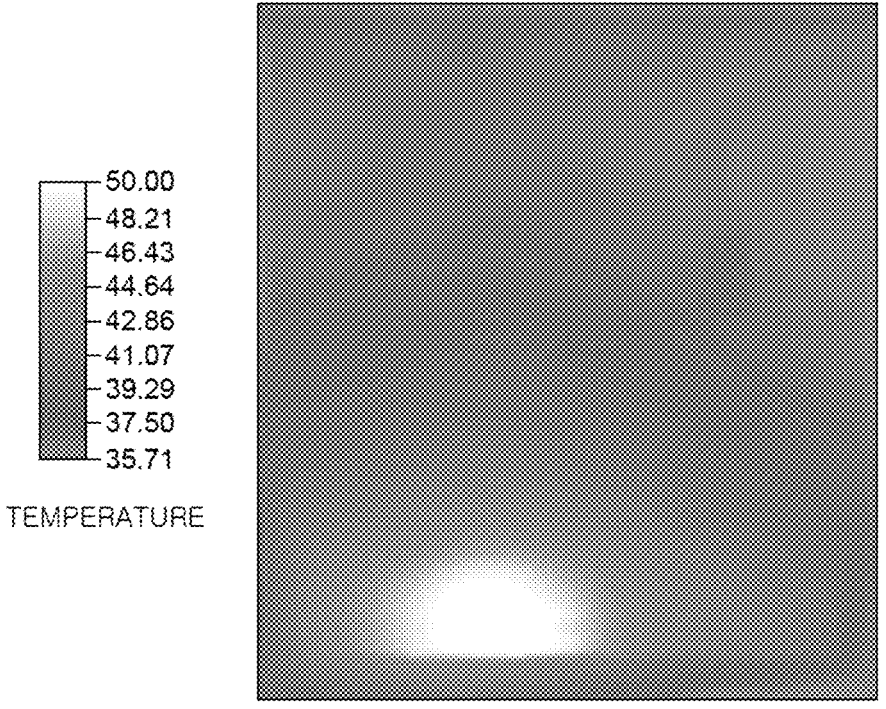
FIGS. 10B and 10C are temperature measurement results of a display device according to Comparative Embodiments 1 and 2.
Figure 10C:
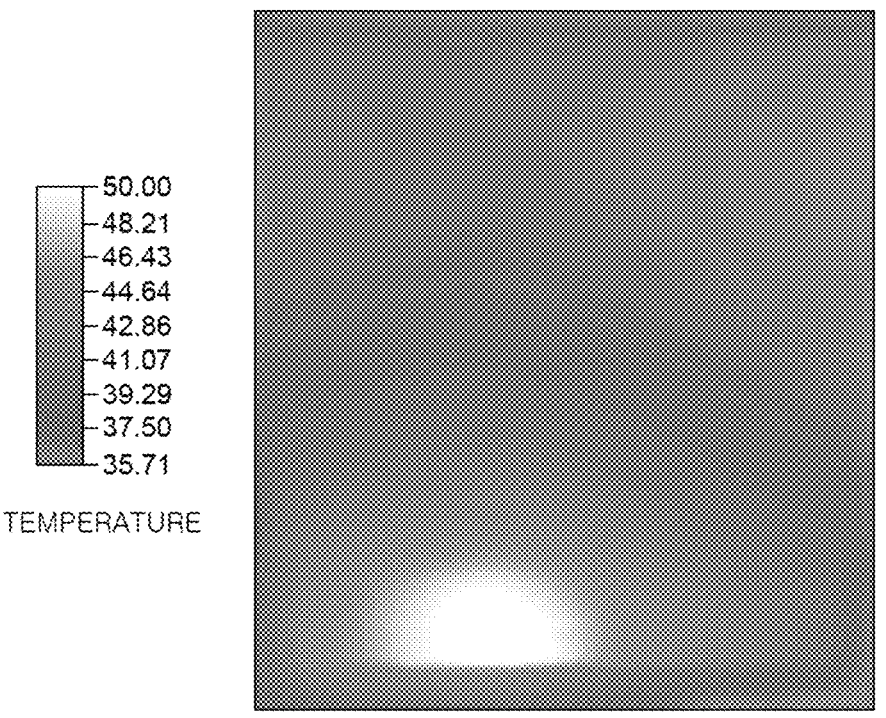

FIG. 10A is a temperature measurement result of a display device according to an exemplary embodiment of the present disclosure. FIGS. 10B and 10C are temperature measurement results of a display device according to Comparative Embodiments 1 and 2. FIG. 11 is an example of a graph illustrating a temperature of a display device of FIGS. 10A to 10C according to a distance. The temperature measurement results of FIGS. 10A to 10C are obtained by measuring the temperature (° C.) on the rear surface of the display panel when the display device is driven. A graph of FIG. 11 represents a temperature (° C.) according to a distance (mm) from the upper end along a center line of FIGS. 10A to 10C. Here, according to Embodiment, the temperature is measured on the rear surface of the display panel PN of the display device 100. Comparative Embodiment 1 has the same structure as the display device 100 except that only a plurality of heat dissipation holes is formed on the cover bottom but the forming unit is not provided. Comparative Embodiment 2 has the same structure as the display device 100 except that the plurality of heat dissipation holes and the forming unit are not formed on the cover bottom.

Figure 11:
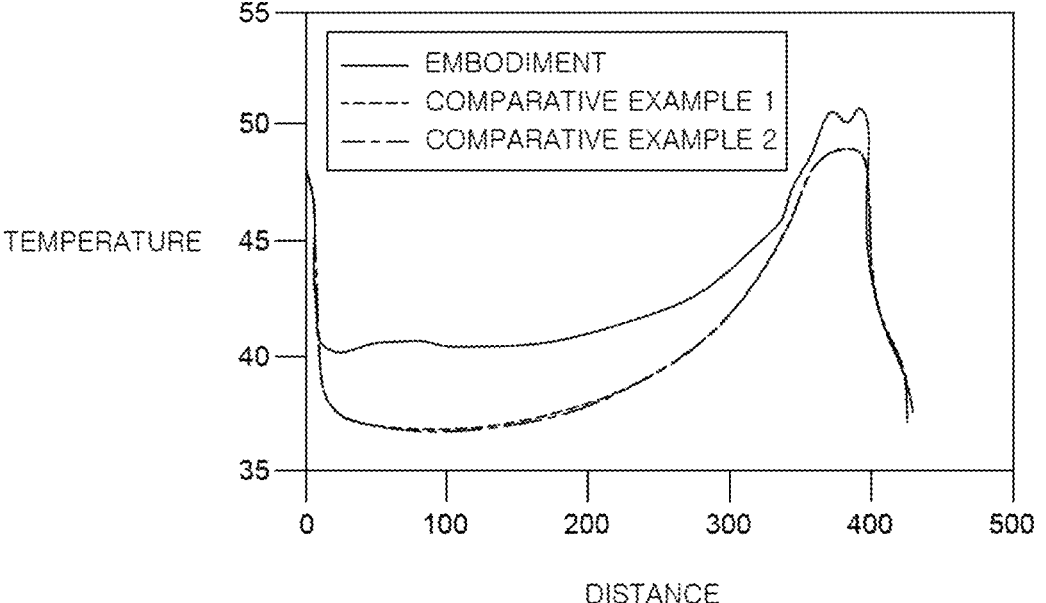
FIG. 11 is an example of a graph illustrating a temperature of a display device of FIGS. 10A to 10C according to a distance.

Referring to FIGS. 10A to 11, in all Embodiment and Comparative Embodiments 1 and 2, a temperature is the highest in the lower end area of the display panel in which the printed circuit board is disposed and the temperature is lower in the remaining area of the display panel. That is, it may be confirmed that there is some temperature difference between the lower end area of the display panel and the remaining area of the display panel.

According to Comparative Embodiments 1 and 2, the temperature measurement results are similar so that it may be confirmed that the heat dissipation effect depending on the presence of the plurality of heat dissipation holes is insignificant. In the meantime, in Comparative Embodiments 1 and 2, the forming unit is not formed so that the overall gap between the display panel and the cover bottom is relatively smaller than that of Embodiment in which the forming unit is formed. Accordingly, heat generated in the printed circuit board or the display panel is quickly transmitted to the cover bottom so that the heat dissipation effect may be increased. Accordingly, the highest temperature of Comparative Embodiments 1 and 2 may be lower than that of Embodiment.

However, in Comparative Embodiments 1 and 2, there is no forming unit of the cover bottom so that it is difficult to ensure a space in which the air circulates in the most area of the display panel. Accordingly, heat generated in the printed circuit board in the lower end area of the display panel is not smoothly dispersed to the remaining area of the display panel. Therefore, the heat generated in the printed circuit board is concentrated only in the lower end area of the display panel so that the entire temperature deviation of the display panel may be increased. That is, as illustrated in FIGS. 10B, 10C, and 11, it may be confirmed that the highest temperature of Comparative Embodiments 1 and 2 is lower than that of Embodiment, but the entire temperature deviation of the display panel is larger than that in Embodiment. When there is a temperature deviation in each area of the display panel, spots are seen from the display panel, a color difference occurs, or a display quality may be degraded.

As compared with Comparative Embodiments 1 and 2, in Embodiment, it may be confirmed that a temperature of the lower end area of the display panel PN in which the printed circuit board PCB is disposed is similar to the temperature of the upper end area and the intermediate area of the display panel PN in which the printed circuit board PCB is not disposed. That is, in the display device 100 according to Embodiment, the cover bottom 160 includes the forming unit 163 so that the heat generated in the lower end area of the display panel PN may be easily dispersed to the intermediate area and the upper end area of the display panel PN. Accordingly, the entire temperature deviation of the display panel PN is reduced and the entire temperature may be uniformly implemented. Therefore, the spots or color difference of the display panel PN is minimized and the display quality may be improved.

Figure 12:
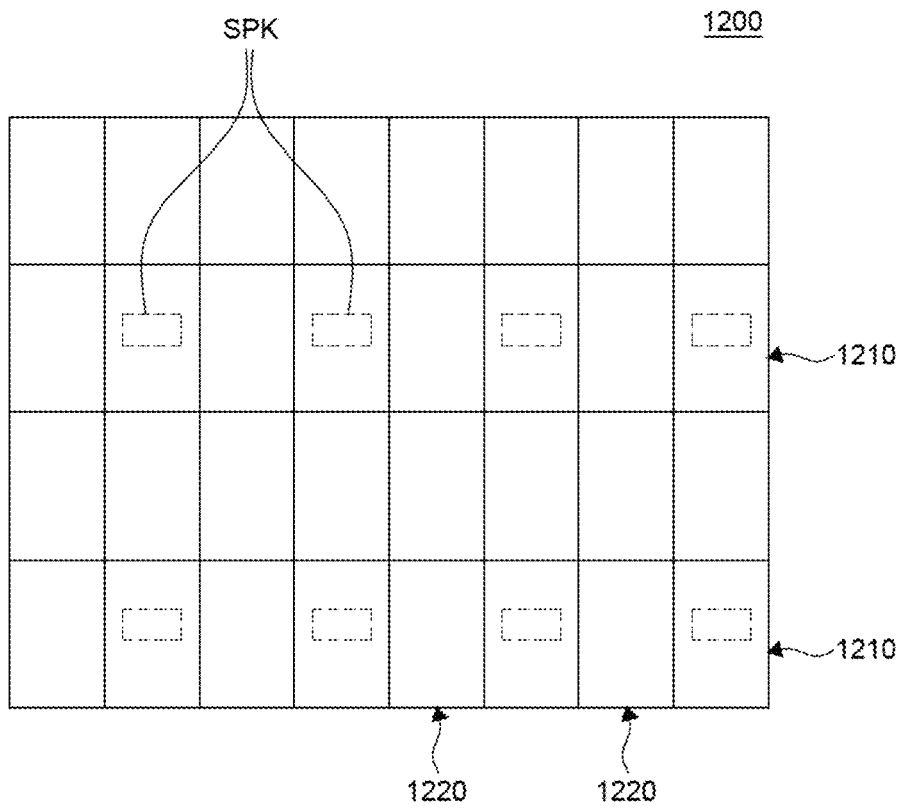
FIG. 12 is a schematic plan view of a tiling display device according to an exemplary embodiment of the present disclosure.
Figure 13:
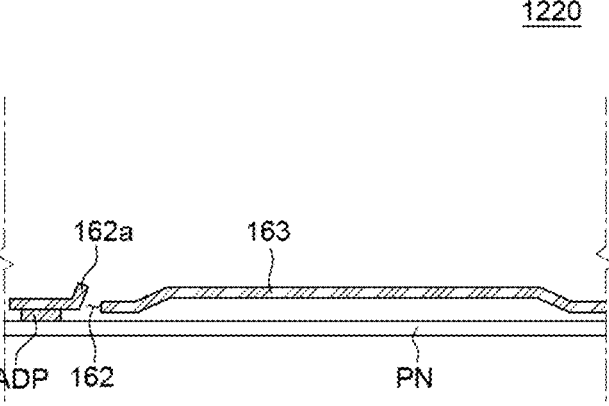
FIG. 13 is an example of a cross-sectional view of a second display panel of a tiling display device of FIG. 12.

FIG. 12 is a schematic plan view of a tiling display device according to an exemplary embodiment of the present disclosure. FIG. 13 is an example of a cross-sectional view of a second display panel of a tiling display device of FIG. 12. FIG. 13 is a cross-sectional view in an area of a second display device 1220 corresponding to FIG. 8. A first display device 1210 is the same as the display device 100 described with reference to FIGS. 1 to 9 so that a redundant description will be omitted.

Referring to FIG. 12, a tiling display device 1200 includes a plurality of display devices 1210 and 1220. The tiling display device 1200 of FIG. 12 may be implemented to be similar to the tiling display device TD of FIG. 2B. The tiling display device 1200 may include a plurality of first display devices 1210 including a speaker SPK and a plurality of second display devices 1220 which does not include a speaker SPK. That is, the speaker SPK may be included in only some of the plurality of display devices 1210 and 1220 which configures the tiling display device 1200.

Referring to FIG. 13, the second display device 1220 does not include the speaker SPK. That is, the speaker SPK is not disposed on the rear surface of the display panel PN of the second display device 1220. However, the second display device 1220 may include the forming unit 163, similar to the first display device 1210. In other words, the second display device 1220 may be formed to be the same as the first display device 1210 except that the speaker SPK is not included. Accordingly, the second display device 1220 reduces the entire temperature deviation of the display panel PN and improves the heat dissipation efficiency by the forming unit 163.

In a normal tiling display device, the speaker may be disposed only in some of the plurality of display devices. Therefore, in the tiling display device, a display device which includes a speaker and a display device which does not include a speaker may be configured to have different structures. Specifically, in the display device including a speaker, as compared with the display device which does not include a speaker, the thickness of the adhesive tape is increased, a gap pad is added, and a thickness of the cover bottom is increased to implement the display device. Therefore, there may be a thickness difference between the display device including a speaker and the display device which does not include a speaker. Further, a boundary between the plurality of display devices which configures the tiling display device is visible due to the thickness difference, which causes the degradation of the display quality. Further, there are disadvantages in that the process efficiency is degraded and the cost is increased due to the different structures of the display device.

The tiling display device 1200 according to the exemplary embodiment of the present disclosure is configured such that the plurality of display devices 1210 and 1220 has the same structure excluding a speaker SPK. That is, the plurality of first display devices 1210 which includes a speaker SPK and the plurality of second display devices 1220 which does not include a speaker SPK may include a cover bottom 160 with the same structure. Accordingly, the structure of the display devices 1210 and 1220 may be shared regardless of whether the speaker SPK is included. Therefore, the process efficiency is improved and a manufacturing cost may be saved. Further, the recognition of the boundary between the plurality of display devices 1210 and 1220 of the tiling display device 1200 is suppressed and the display quality may be improved.

The exemplary embodiments of the present disclosure can also be described as follows:

According to an aspect of the present disclosure, a display device comprises a display panel, a speaker disposed on a rear surface of the display panel, a printed circuit board which is disposed on the rear surface of the display panel and is spaced apart from the speaker, and a cover bottom which is disposed between the display panel and the printed circuit board and includes a forming unit corresponding to the speaker, wherein the forming unit protrudes in a direction perpendicular to the rear surface of the display panel to accommodate the speaker.

The speaker may be disposed between the forming unit and the display panel.

The forming unit may be spaced apart from the printed circuit board.

An interval between the cover bottom and the display panel in the forming unit may be larger than an interval between the cover bottom and the display panel at an edge of the cover bottom.

The cover bottom may further include a first opening overlapping the printed circuit board, and a plurality of second openings disposed along an edge of the cover bottom, and the forming unit may be spaced apart from the first opening and the plurality of second openings.

The forming unit may be disposed so as to be enclosed by the first opening and the plurality of second openings.

The display device may further comprise a plate bottom which is disposed between the cover bottom and the printed circuit board and overlaps at least a part of the first opening of the cover bottom, a cover shield which covers the printed circuit board and the plate bottom, and a fastening member which passes through the cover shield and the printed circuit board to be fastened with the plate bottom. The cover shield, the printed circuit board, and the plate bottom may be connected to each other by the fastening member.

The display device may further comprise a cable which connects the speaker and the printed circuit board, and the forming unit may include a cable hole through which the cable passes.

The forming unit may further include a plurality of heat dissipation holes which is spaced apart from the cable hole.

The forming unit may include a plurality of corner holes disposed at a corner of the forming unit.

The forming unit may include a first area in the middle of the forming unit, and a second area which connects a remaining area of the cover bottom at an outer periphery of the forming unit and the first area and is inclined.

A width of the second area may be larger than a height of the second area, the width may be a length in a direction parallel to the display panel, and the height may be a length in a direction perpendicular to the display panel.

Another aspect of the present disclosure provides a tiling display device in which a plurality of display devices is connected. Each of the plurality of display devices may include a display panel, a printed circuit board disposed on a rear surface of the display panel, and a cover bottom which is disposed between the display panel and the printed circuit board and includes a forming unit spaced apart from the printed circuit board. The forming unit may protrude in a direction perpendicular to the rear surface of the display panel, and some of the plurality of display devices may further include a speaker disposed so as to correspond to the forming unit on the rear surface of the display panel.

The speaker may be disposed between the forming unit and the display panel.

In a remaining part of the plurality of display devices, the speaker may be not disposed between the forming unit and the display panel.

The forming unit may include a plurality of heat dissipation holes disposed in the middle of the forming unit, and a plurality of corner holes disposed at a corner of the forming unit.

The forming unit may include a first area in the middle of the forming unit, and a second area which connects a remaining area of the cover bottom at an outer periphery of the forming unit and the first area and is inclined.

A width of the second area is larger than a height of the second area and the width is a length in a direction parallel to the display panel and the height may be a length in a direction perpendicular to the display panel.

The cover bottom may further include a first opening overlapping the printed circuit board, and a plurality of second openings disposed along an edge of the cover bottom, and the forming unit is disposed so as to be enclosed by the first opening and the plurality of second openings.

An interval between the cover bottom and the display panel in the forming unit may be larger than an interval between the cover bottom and the display panel at an edge of the cover bottom.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display panel;
a speaker disposed on a rear surface of the display panel;
a printed circuit board which is disposed on the rear surface of the display panel and is spaced apart from the speaker; and
a cover bottom which is disposed between the display panel and the printed circuit board and includes a forming unit corresponding to the speaker,
wherein the forming unit protrudes in a direction perpendicular to the rear surface of the display panel to accommodate the speaker.

2. The display device according to claim 1, wherein the speaker is disposed between the forming unit and the display panel.

3. The display device according to claim 1, wherein the forming unit is spaced apart from the printed circuit board.

4. The display device according to claim 1, wherein an interval between the cover bottom and the display panel in the forming unit is larger than an interval between the cover bottom and the display panel at an edge of the cover bottom.

5. The display device according to claim 1, wherein the cover bottom further includes:
a first opening overlapping the printed circuit board; and
a plurality of second openings disposed along an edge of the cover bottom, and
wherein the forming unit is spaced apart from the first opening and the plurality of second openings.

6. The display device according to claim 5, wherein the forming unit is disposed so as to be enclosed by the first opening and the plurality of second openings.

7. The display device according to claim 5, further comprising:
a plate bottom which is disposed between the cover bottom and the printed circuit board and overlaps at least a part of the first opening of the cover bottom;
a cover shield which covers the printed circuit board and the plate bottom; and a fastening member which passes through the cover shield and the printed circuit board to be fastened with the plate bottom, and
wherein the cover shield, the printed circuit board, and the plate bottom are connected to each other by the fastening member.

8. The display device according to claim 1, further comprising:
a cable which connects the speaker and the printed circuit board,
wherein the forming unit includes a cable hole through which the cable passes.

9. The display device according to claim 8, wherein the forming unit further includes a plurality of heat dissipation holes which is spaced apart from the cable hole.

10. The display device according to claim 1, wherein the forming unit includes a plurality of corner holes disposed at a corner of the forming unit.

11. The display device according to claim 1, wherein the forming unit includes:
a first area in a middle of the forming unit; and
a second area which connects a remaining area of the cover bottom at an outer periphery of the forming unit and the first area and is inclined.

12. The display device according to claim 11, wherein a width of the second area is larger than a height of the second area, the width is a length in a direction parallel to the display panel, and the height is a length in a direction perpendicular to the display panel.

13. A tiling display device in which a plurality of display devices is connected, wherein each of the plurality of display devices comprises:
a display panel;
a printed circuit board disposed on a rear surface of the display panel; and
a cover bottom which is disposed between the display panel and the printed circuit board and includes a forming unit spaced apart from the printed circuit board, and
wherein the forming unit protrudes in a direction perpendicular to the rear surface of the display panel, and some of the plurality of display devices further includes a speaker disposed so as to correspond to the forming unit on the rear surface of the display panel.

14. The tiling display device according to claim 13, wherein the speaker is disposed between the forming unit and the display panel.

15. The tiling display device according to claim 14, wherein in a remaining part of the plurality of display devices, the speaker is not disposed between the forming unit and the display panel.

16. The tiling display device according to claim 13, wherein the forming unit includes:
a plurality of heat dissipation holes disposed in a middle of the forming unit; and
a plurality of corner holes disposed at a corner of the forming unit.

17. The tiling display device according to claim 13, wherein the forming unit includes:
a first area in a middle of the forming unit; and
a second area which connects a remaining area of the cover bottom at an outer periphery of the forming unit and the first area and is inclined.

18. The tiling display device according to claim 17, wherein a width of the second area is larger than a height of the second area, the width is a length in a direction parallel to the display panel, and the height is a length in a direction perpendicular to the display panel.

19. The tiling display device according to claim 13, wherein the cover bottom further includes:

a first opening overlapping the printed circuit board; and a plurality of second openings disposed along an edge of the cover bottom, and wherein the forming unit is disposed so as to be enclosed by the first opening and the plurality of second openings.

20. The tiling display device according to claim 13, wherein an interval between the cover bottom and the display panel in the forming unit is larger than an interval between the cover bottom and the display panel at an edge of the cover bottom.

\* \* \* \* \*